United States Patent [19]
Roshen et al.

[11] Patent Number: 5,745,981
[45] Date of Patent: May 5, 1998

[54] METHOD FOR MAKING MAGNETIC AND ELECTROMAGNETIC CIRCUIT COMPONENTS HAVING EMBEDDED MAGNETIC MATERIALS IN A HIGH DENSITY INTERCONNECT STRUCTURE

[75] Inventors: Waseem Ahmed Roshen, Clifton Park; Charles Steven Korman; Wolfgang Daum, both of Schenectady, all of N.Y.

[73] Assignee: General Electric Company, Schenectady, N.Y.

[21] Appl. No.: 588,525

[22] Filed: Jan. 18, 1996

Related U.S. Application Data

[62] Division of Ser. No. 43,166, Apr. 1, 1993, Pat. No. 5,525,941.

[51] Int. Cl.⁶ .................................................. H01F 4/06
[52] U.S. Cl. ....................... 29/607; 29/602.1; 333/24.2; 333/112; 336/200; 336/232
[58] Field of Search ............................. 29/602.1, 606, 29/607; 336/200, 232; 333/112, 24.2

[56] References Cited

U.S. PATENT DOCUMENTS 5,349,743  9/1994  Grader et al. .................... 29/602.1

*Primary Examiner*—Carl E. Hall
*Attorney, Agent, or Firm*—Jill M. Breedlove; Douglas E. Stoner

[57] ABSTRACT

A magnetic or electromagnetic circuit component includes an embedded magnetic material (e.g., ferromagnetic) in an HDI structure with alternating dielectric and metal or winding layers. In one embodiment, the ferromagnetic material is situated in a substrate well, or cavity, with or without an adhesive. Alternatively, the ferromagnetic material is co-fired with the ceramic substrate and then machined to achieve a required core shape. An electroplating process is employed to construct the metal layers, such process including differential plating for varying the thickness of metal layers and/or other portions of the circuit. Laser ablation or any other suitable technique is employed to make through-holes for insertion of the posts of a ferromagnetic core plate used to complete a magnetic circuit, if required. Advantageously, a magnetic or electromagnetic component may have a height of less than about 0.1 inch. Furthermore, such magnetic or electromagnetic circuit components allow for very low inductance interconnections between these components and other circuit elements. Moreover, in a power supply, for example, not only can the complete power supply be built using HDI technology, but power density is increased at relatively low cost and at a high level of reproducibility.

30 Claims, 26 Drawing Sheets

——— 1st LAYER
- - - - 3rd LAYER

——— 2nd LAYER

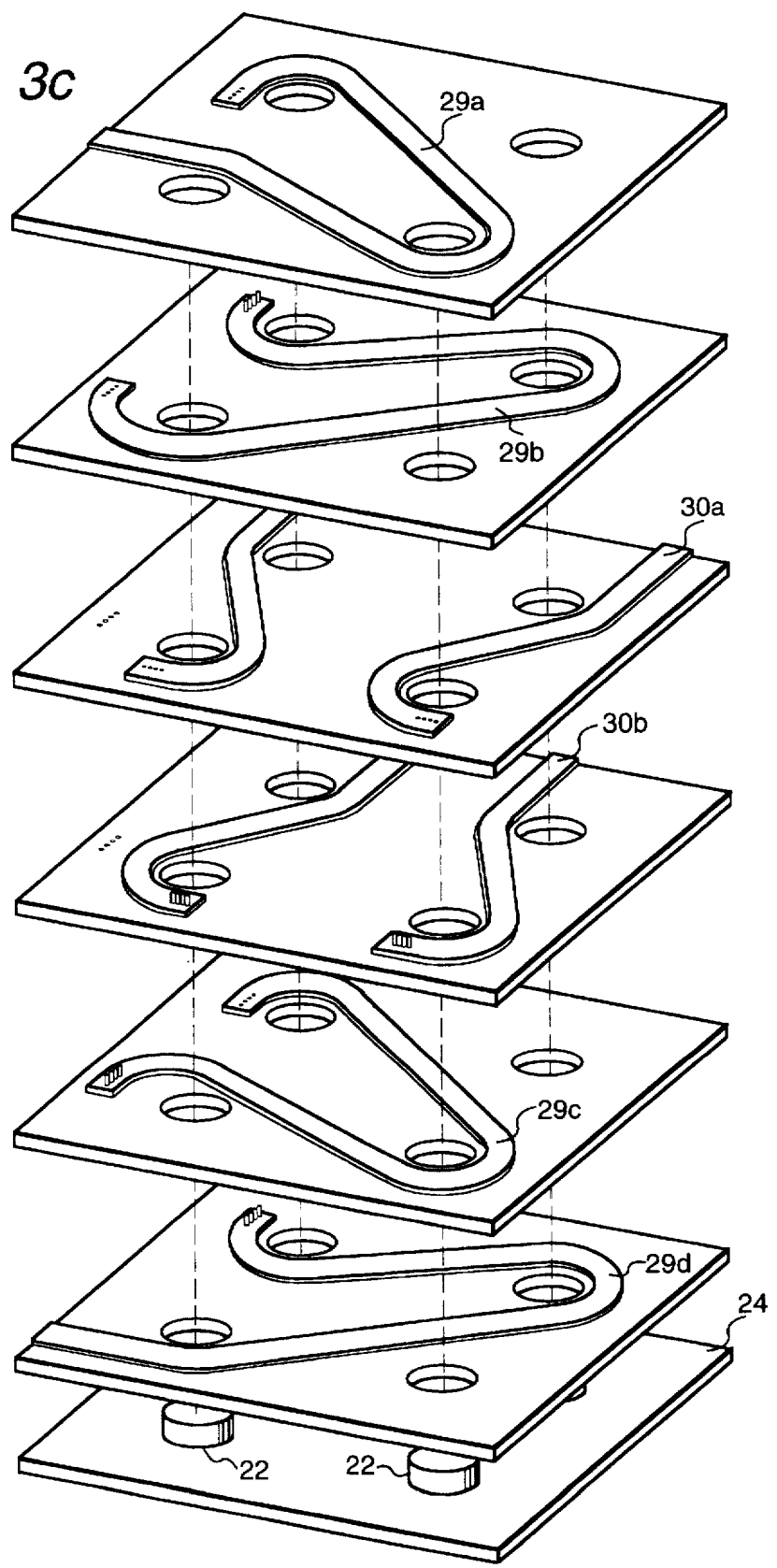

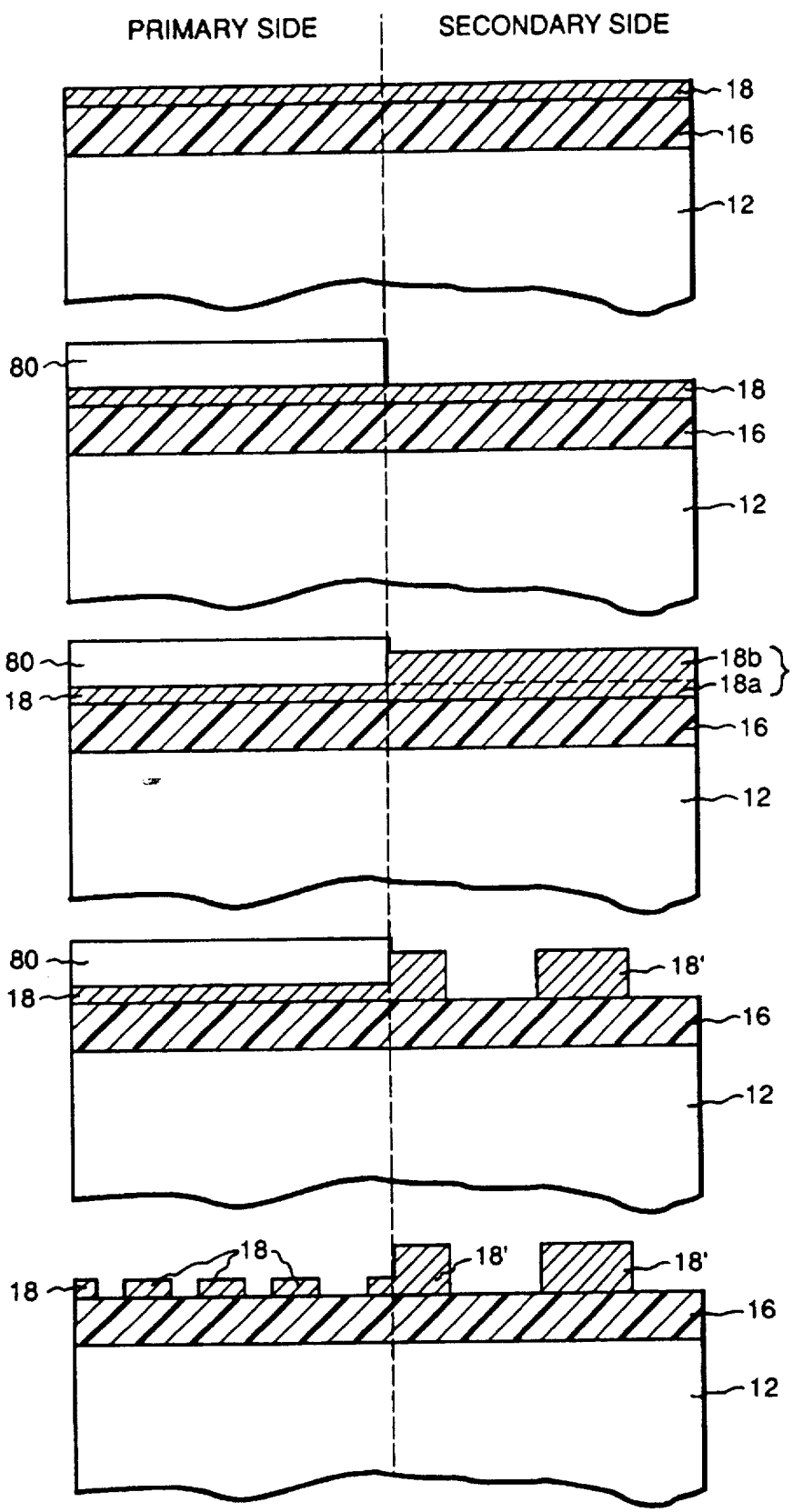

PRIMARY SIDE | SECONDARY SIDE

METHOD FOR MAKING MAGNETIC AND ELECTROMAGNETIC CIRCUIT COMPONENTS HAVING EMBEDDED MAGNETIC MATERIALS IN A HIGH DENSITY INTERCONNECT STRUCTURE

This application is a division, of application Ser. No. 08/043.166 filed Apr. 01, 1993 now U.S. Pat. No. 5,525,941.

FIELD OF THE INVENTION

The present invention relates generally to magnetic circuit components (e.g., transformers, inductors, and coupled inductors) and electromagnetic circuit components (e.g., directional couplers, isolators, waveguides, phase-shifters and circulators) employing embedded magnetic material and electroplated or differentially electroplated metal layers or windings in high density interconnect (HDI) structures.

BACKGROUND OF THE INVENTION

More and more integrated circuits (IC's), including signal IC's and microwave IC's, are being constructed using high density interconnect (HDI) technology. As described in commonly assigned U.S. Pat. No. 4,783,695 of Eichelberger et al., issued Nov. 8, 1988, which is incorporated by reference herein, and in other related patents, HDI structures offer many advantages in the compact assembly of, for example, digital and other electronic systems. Furthermore, as described in commonly assigned U.S. patent application Ser. No. 07/504.821 of Kornrumpf et al., filed Apr. 5, 1990, now abandoned in favor of Continuation application Ser. No. 07/869,090, filed Apr. 14, 1992, HDI technology has been extended to microwave systems. Furthermore, HDI technology has been extended to support the building of power circuits, as described in commonly assigned U.S. patent application Ser. No. 08/002,374 of Neugebauer et al., filed Jan. 8, 1993. The Neugebauer et al. application describes how HDI may be used to integrate diverse power components, with the magnetic elements being treated as discrete elements.

In order to completely integrate a power supply with HDI digital and microwave modules, it is desirable to be able to construct the power supply, including magnetic components, using the same technology, i.e., HDI. In order to build magnetic components in an HDI structure, the height of the magnetic component must be very small, e.g., less than about 0.1 inch. Such thin magnetic components generally require multi-pole core structures, such as described in commonly assigned U.S. Pat. No. 5,126,715 of Yerman and Roshen, issued Jun. 30, 1992 and incorporated by reference herein.

In addition to lumped magnetic components, it is also desirable to be able to construct distributed electromagnetic circuit components using HDI technology for integration in, for example, HDI microwave modules.

SUMMARY OF THE INVENTION

A magnetic or electromagnetic circuit component comprises an embedded magnetic material (e.g., ferromagnetic) in an HDI structure with alternating dielectric and metal or winding layers. In one embodiment, the ferromagnetic material is situated in a substrate well, or cavity, with or without an adhesive. Alternatively, the ferromagnetic material is co-fired with the ceramic substrate and then machined to achieve a required core shape. An electroplating process is employed to construct the metal layers, such process including differential plating for varying the thickness of metal layers and/or other portions of the circuit. Laser ablation or any other suitable technique is employed to make through-holes for insertion of the posts of a ferromagnetic core plate used to complete a magnetic circuit, if required. Advantageously, a magnetic or electromagnetic component built according to the present invention may have a height of less than about 0.1 inch. Furthermore, using magnetic or electromagnetic circuit components constructed according to the present invention allows for very low inductance interconnections between these components and other circuit elements. Moreover, in a power supply, for example, not only can the complete power supply be built using HDI technology, but power density is increased at relatively low cost and at a high level of reproducibility.

BRIEF DESCRIPTION OF THE DRAWINGS

The features and advantages of the present invention will become apparent from the following detailed description of the invention when read with the accompanying drawings in which:

FIG. 3c is an exploded, perspective view illustrating the primary and secondary winding layers of FIGS. 3a and 3b in a transformer according to the present invention;

FIGS. 8a–8e illustrate differential plating steps according to the present invention;

DETAILED DESCRIPTION OF THE INVENTION

Figure 1:
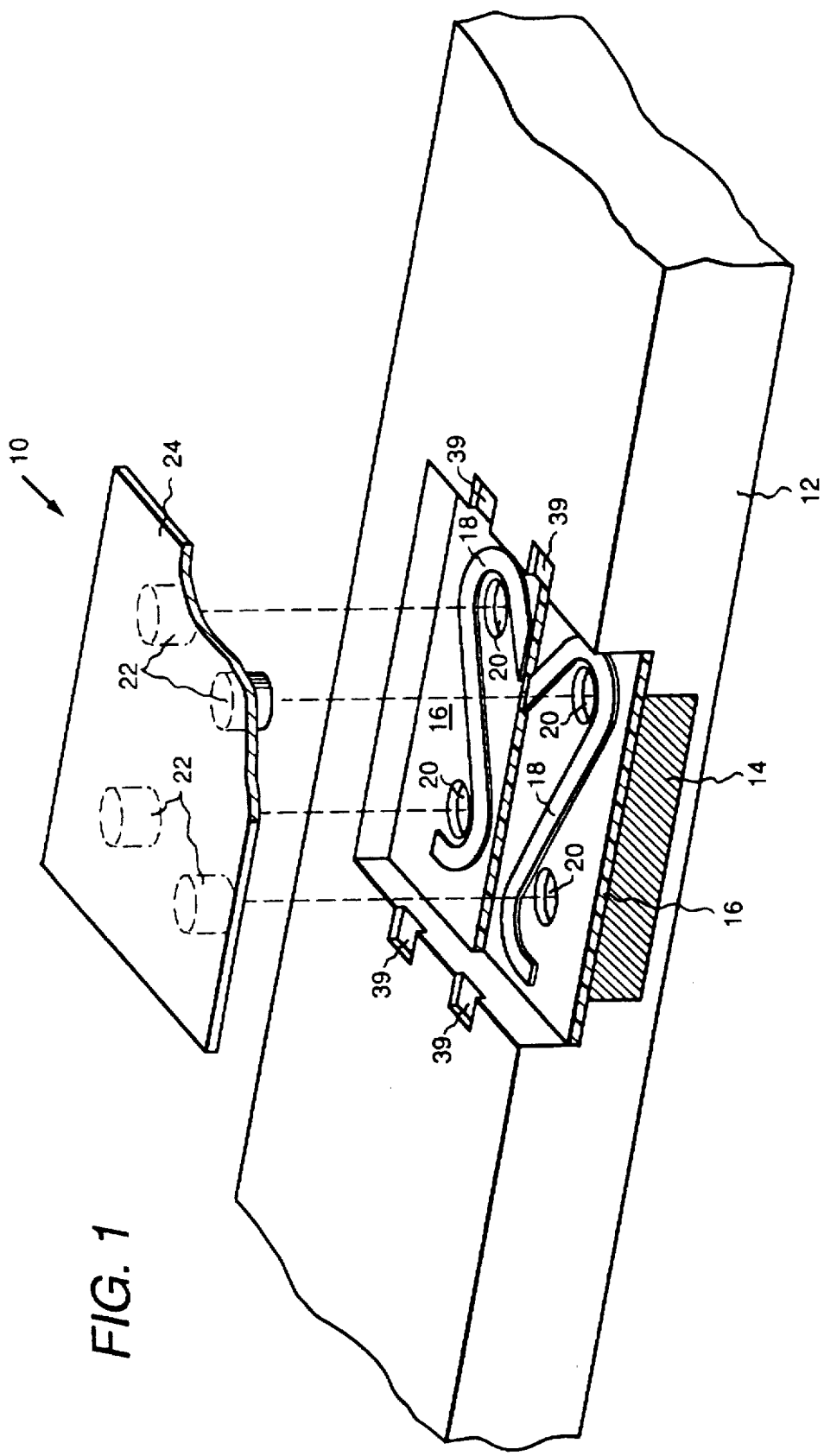
FIG. 1 is an exploded, perspective view of a transformer constructed in accordance with the present invention with first and second winding layers patterned therein.

FIG. 1 illustrates a transformer 10 constructed in accordance with the present invention. Transformer 10 includes an HDI substrate 12 having a magnetic plate 14 embedded therein and alternating dielectric 16 and winding layers 18. By way of example, magnetic plate 14 is described herein as comprising a ferromagnetic plate. However, other suitable magnetic plates may be used, such as comprising magnetically polarized materials or other materials exhibiting magnetic characteristics. Substrate 12 may comprise a ceramic or other suitable material. Through-holes 20 are provided for receiving core posts 22 of a top ferrite plate 24 upon completion of the transformer assembly.

Figure 2A:
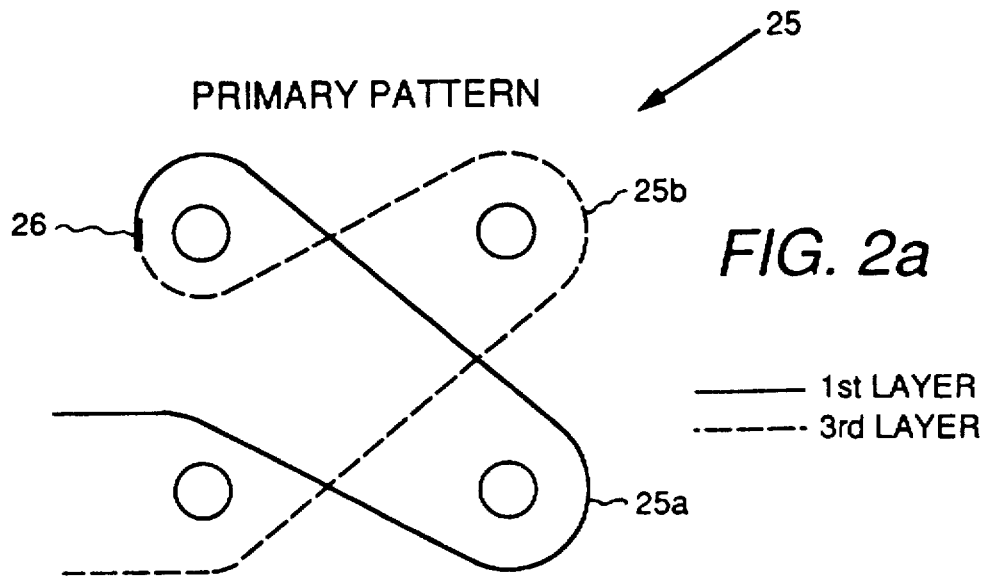
FIGS. 2a and 2b are plan views of suitable primary and secondary winding patterns, respectively, for use in the transformer of FIG. 1.
Figure 2B:
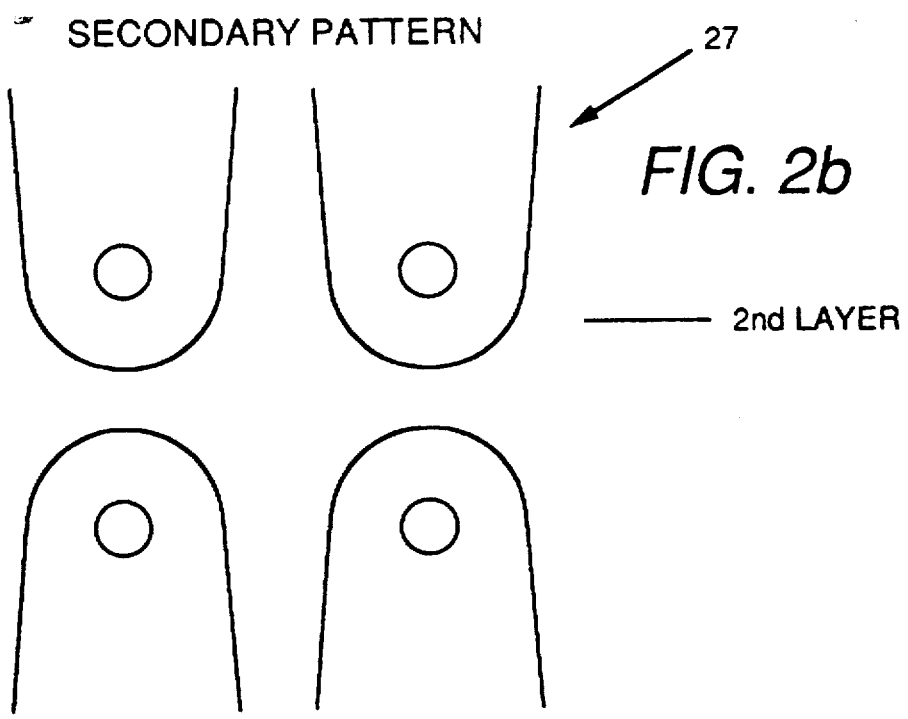
Figure 2C:
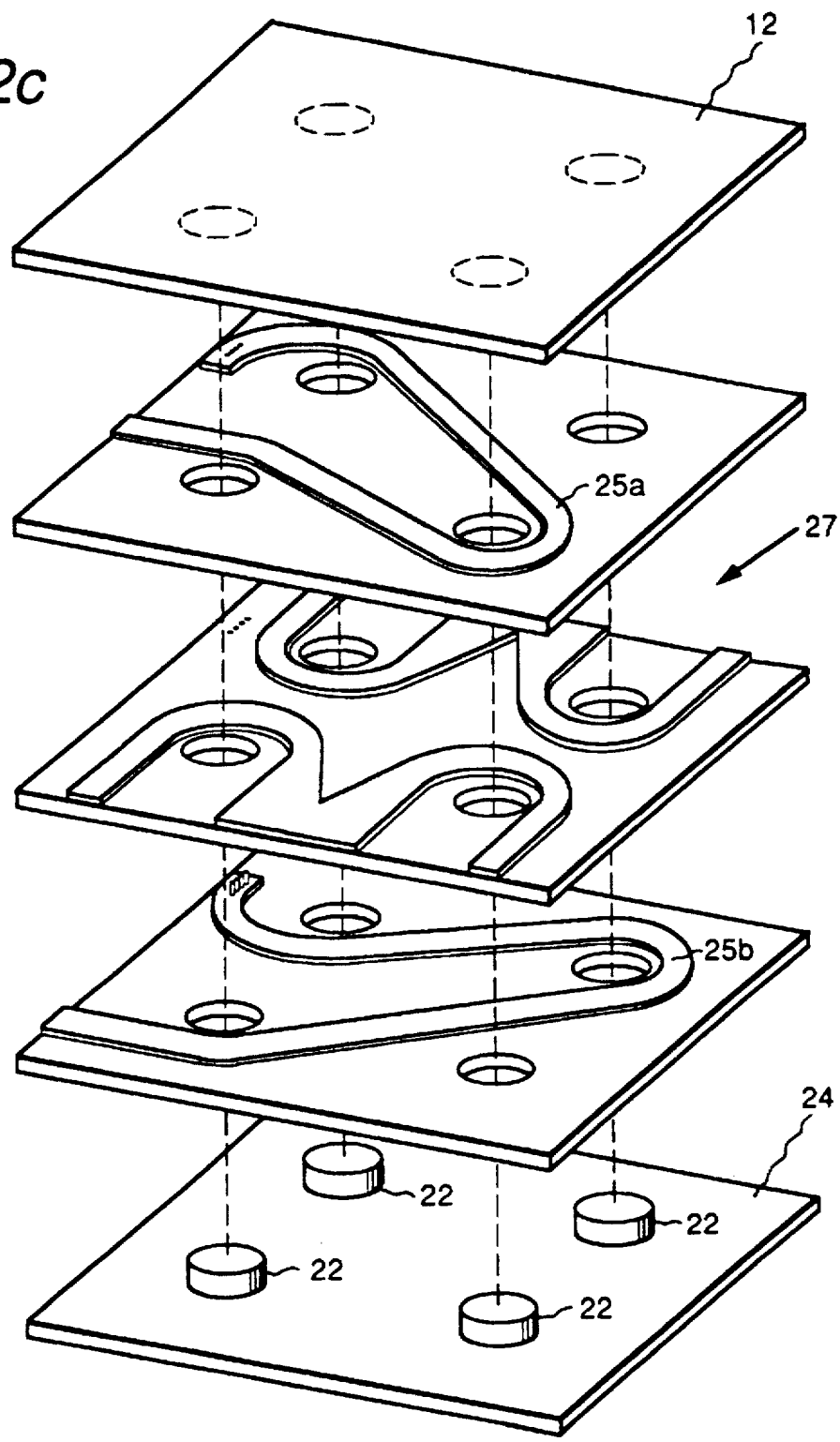
FIG. 2c is an exploded, perspective view illustrating the primary and secondary winding layers of FIGS. 2a and 2b in a transformer according to the present invention.

By way of example, transformer 10 is illustrated as comprising a multi-pole (e.g., four-pole) winding structure. However, the present invention applies to single-pole winding structures as well. Suitable winding configurations are shown in the plan views of FIGS. 2a and 2b. Primary winding 25 of FIG. 2a is shown as having a total of four turns with a single turn around each of the four poles. Specifically, each primary winding layer 25a and 25b has one-half turn around each pole, each turn being connected in series in circuit. A via 26 is used for connecting the two primary winding layers. FIG. 2b shows a single-layer secondary winding 27 with a single turn around each pole, all secondary turns being connected in parallel (not shown). The result is a transformer turns ratio of 4:1. FIG. 2c is an exploded, perspective view illustrating the winding layers of the pattern of FIG. 2.

Figure 3A:
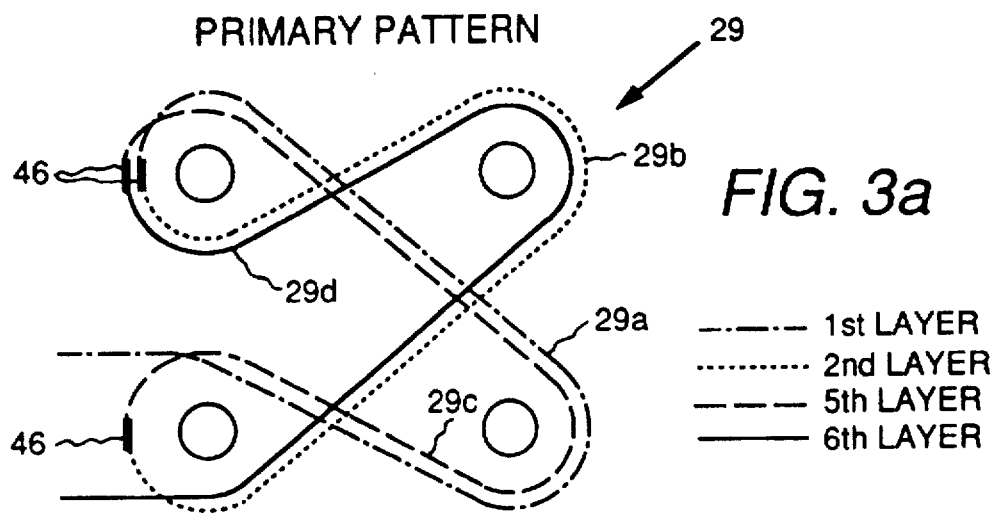
FIGS. 3a and 3b are plan views of suitable primary and secondary winding patterns, respectively, for use in the transformer of FIG. 1.
Figure 3B:
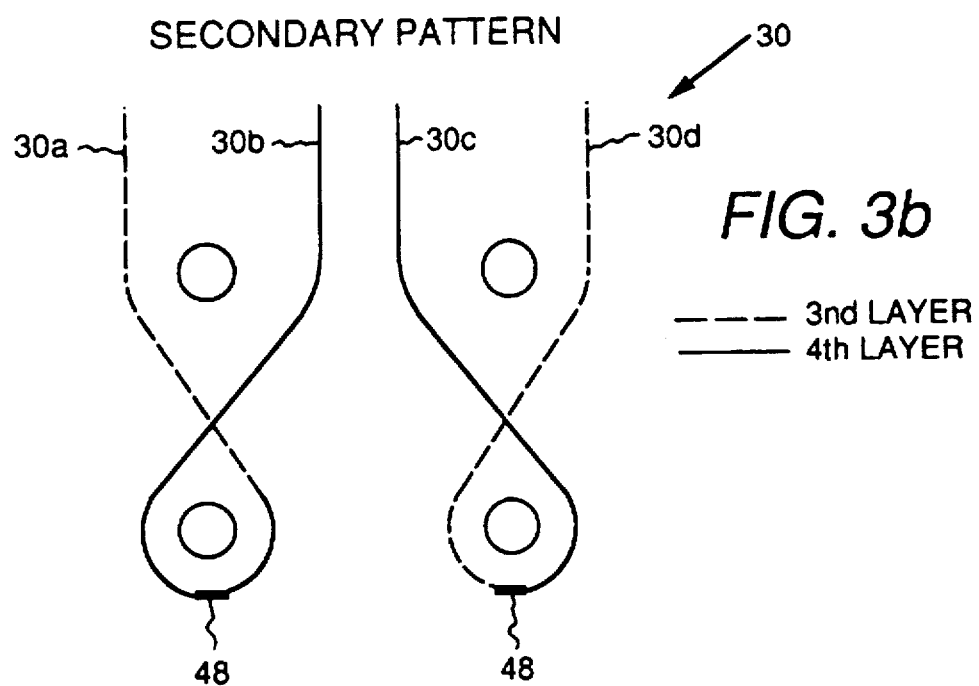

Another suitable winding configuration is shown in FIGS. 3a–3c. Similar suitable winding configurations are described in commonly assigned U.S. patent application Ser. No. 07/838,953 (docket RD-21,008) of Roshen et al. and in commonly assigned U.S. patent application Ser. No. 07/838,958 (docket RD-21,748) of Yerman et al., both of which are incorporated by reference herein.

Primary winding 29 of FIG. 3a is shown as having a total of eight turns with two turns around each of the four poles, all turns being connected in series. In each primary winding layer 29a–29d, there is one-half turn around each pole. FIG. 3b shows two secondary winding layers 30a and 30b, each having two turns which are connected in parallel. The result is a transformer turns ratio of 8:2 or 4:1, for this example. FIG. 3c is an exploded, perspective view of the windings of FIGS. 3a and 3b.

Figure 4A:
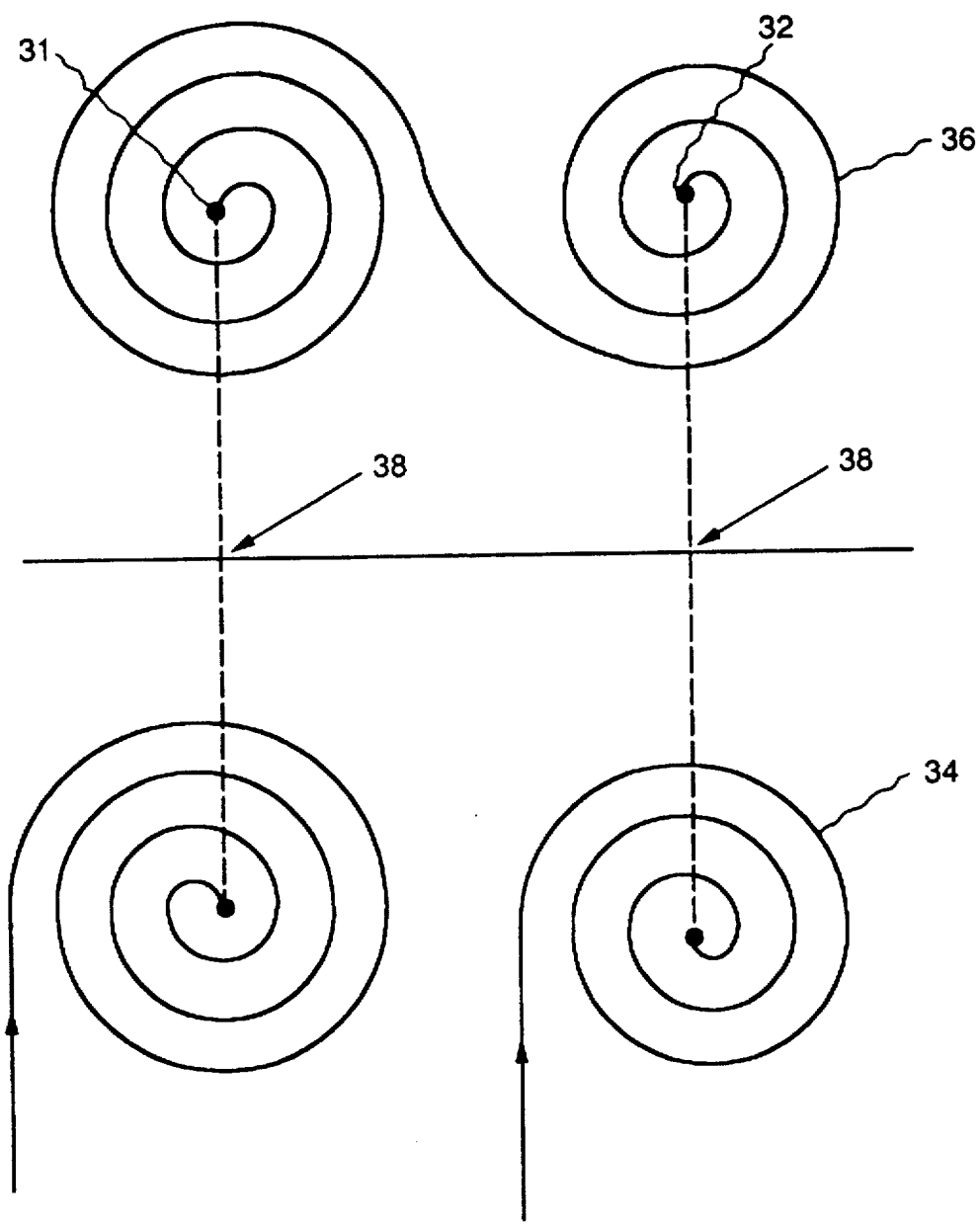
FIG. 4a is a plan view illustrating another suitable winding configuration for use in the transformer of FIG. 1.
Figure 4B:
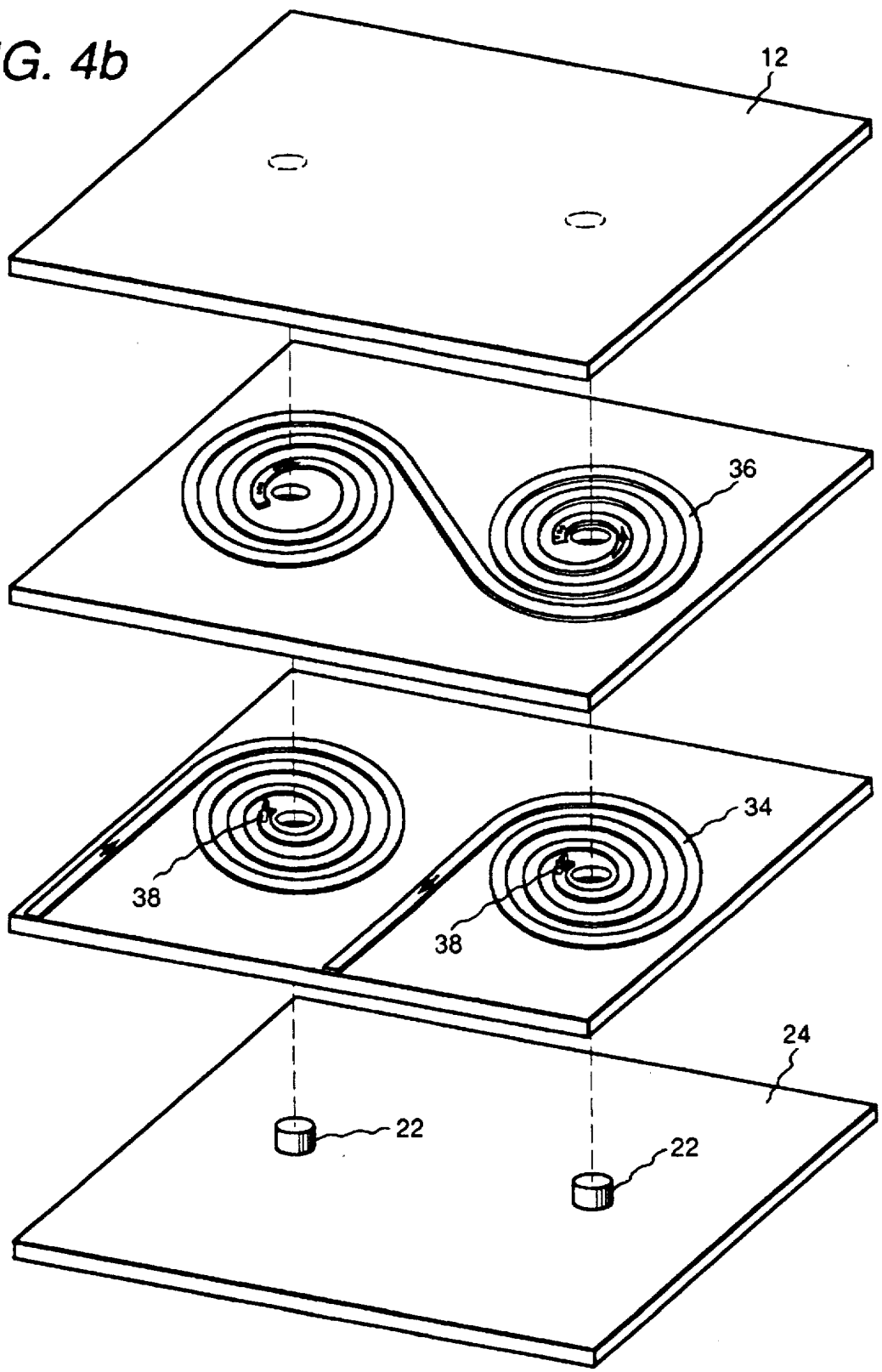
FIG. 4b is an exploded, perspective view illustrating the primary and secondary winding layers of FIG. 4a in a transformer according to the present invention.

It is to be understood, however, that the particular winding ratios and configurations are illustrated herein by way of example only and that other suitable winding ratios and configurations may be chosen depending upon the particular application. As another example, FIGS. 4a–4b illustrate a spiral-type winding for a two-pole, two metal-layer design. In particular, multiple turns and current direction about poles 31 and 32 are shown for conductor layers 34 and 36 of FIG. 4, with numeral 38 indicating the locations of vias for making connections between the winding layers. Thus, many different winding ratios and configurations are possible which are of practical interest. However, the choice of a winding ratio may require trade-offs with regard to size, number of poles, number of conductor layers, thickness of conductor layers, efficiency, and so on, depending on the application. Furthermore, inductors with single windings may be constructed using embedded ferromagnetics in HDI structures according to the present invention.

Figure 5A:
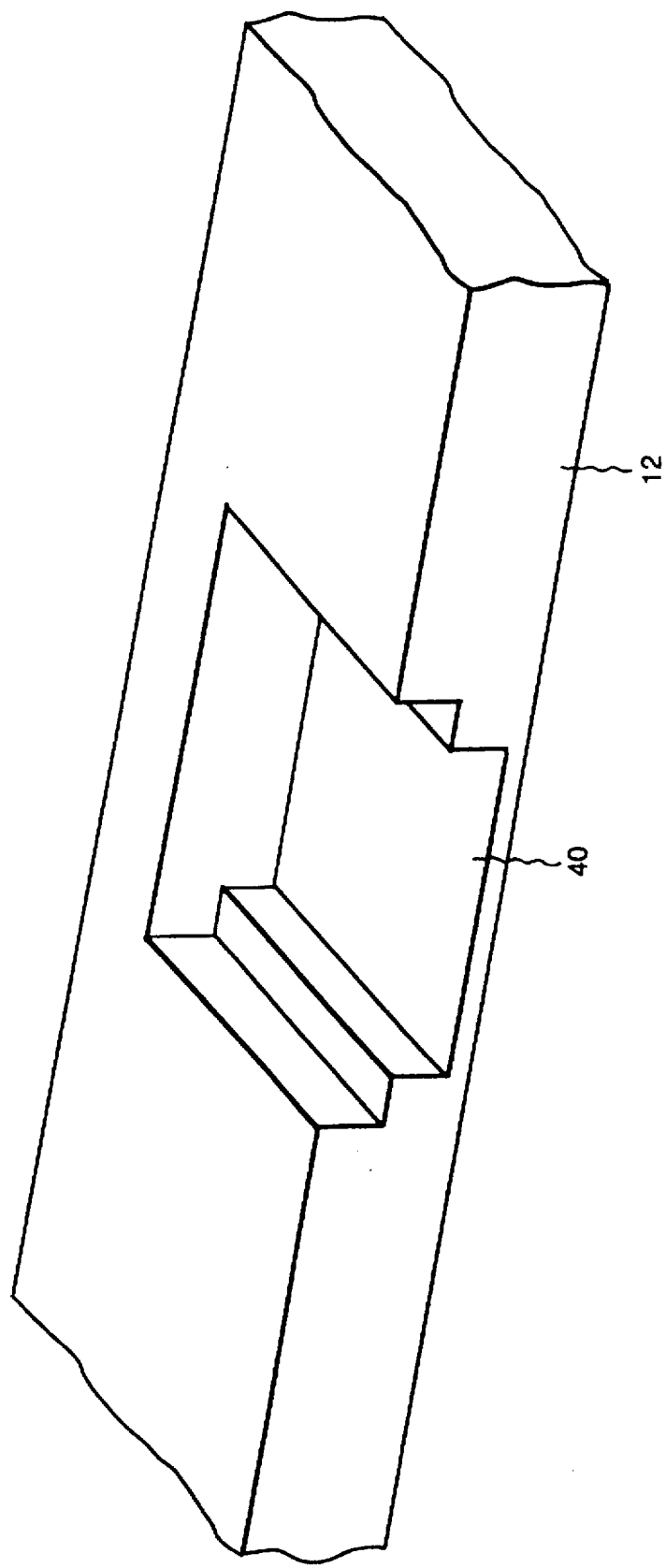
FIGS. 5a–5f are perspective views illustrating the process of constructing the transformer of FIG. 1 in accordance with the present invention.
Figure 5B:
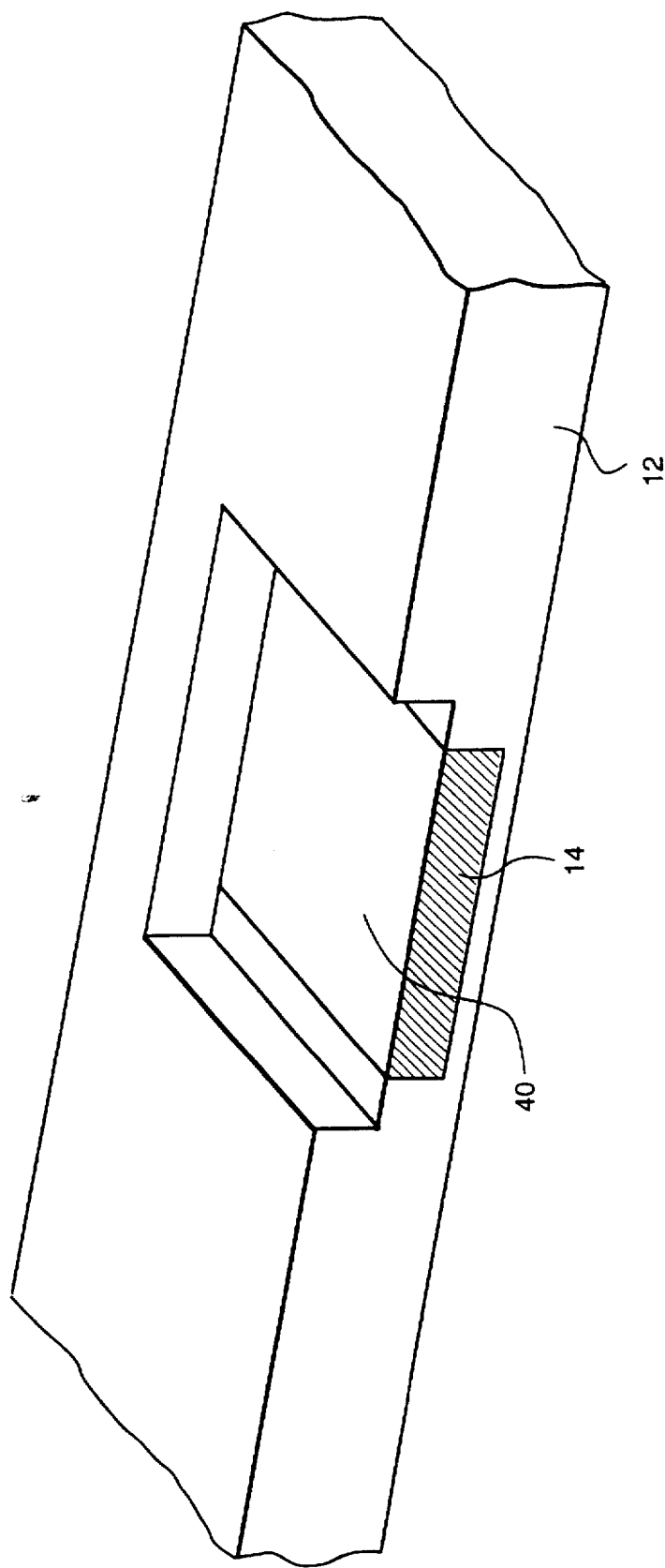

By way of example, FIGS. 5a–5f illustrate the steps in constructing transformer 10 of FIG. 1 with windings 29 and 30 of FIGS. 3a–3c. As shown in FIG. 5a, a step cavity 40 is machined (e.g., by diamond milling, potting, stamping or other extraction methods) in ceramic substrate 12. As shown in FIG. 5b, ferromagnetic plate 14, which has been machined to fit within cavity 40, is attached to the cavity with a suitable adhesive, such as, for example, ULTEM 6000 glue manufactured by General Electric Company. Alternatively, a non-conducting SPAN polymer manufactured by General Electric Company may be used to attach ferromagnetic plate 14 within cavity 40. As still another alternative, a thermosetting epoxy can be used which can be loaded with, for example, alumina or beryllia or aluminum nitride to achieve thermal conduction to the substrate. The epoxy could also be loaded with silver to achieve the same effect. As yet another alternative, ferromagnetic plate 14 may be inserted within the cavity without using an adhesive to attach it thereto, if desired. Ferromagnetic plate 14 may comprise, for example, a suitable ferrite such as, for example, MnZn or NiZn. An exemplary ferrite plate thickness is from approximately 0.02 to 0.03 inch.

Figure 5C:
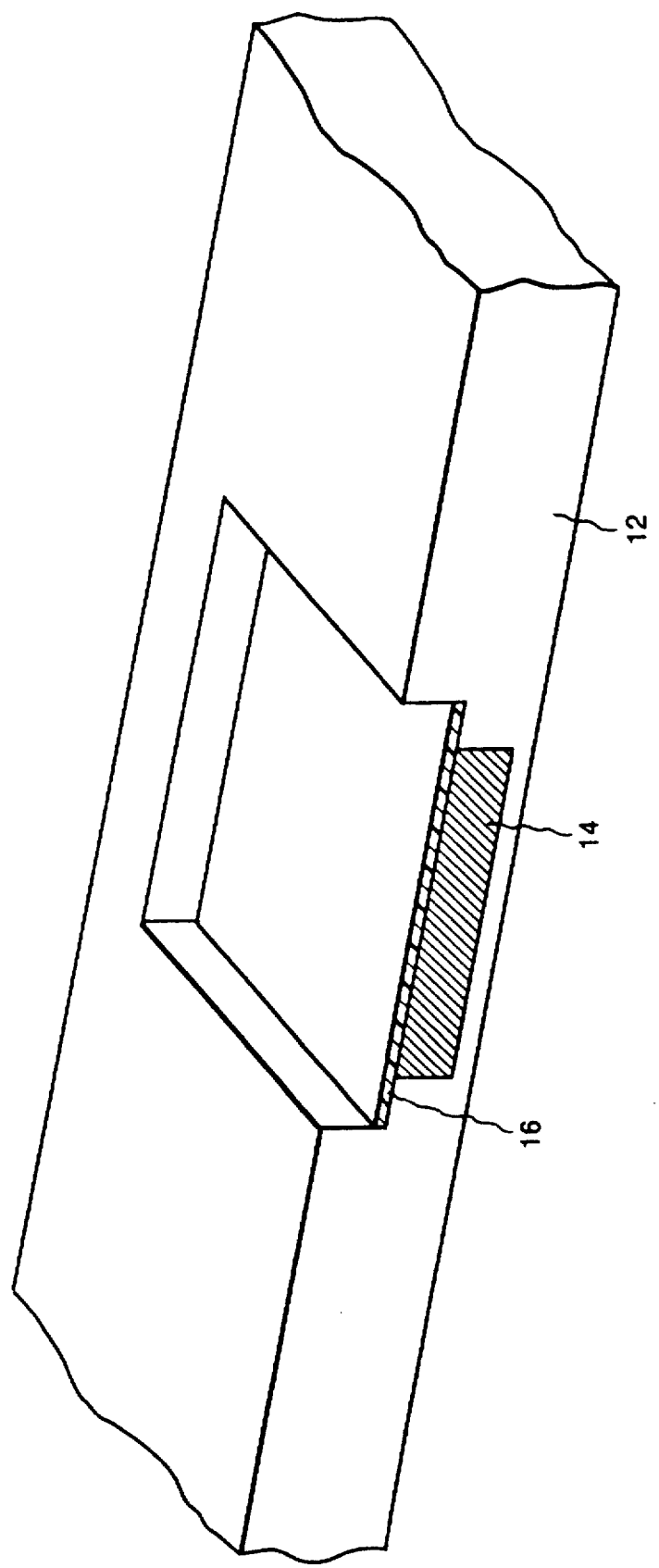

As shown in FIG. 5c, dielectric layer 16 is laminated over ferromagnetic plate 14 with an adhesive such as, for example, ULTEM 1000 glue manufactured by General Electric Company. A suitable dielectric comprises, for example, a polyimide film such as that sold under the name Kapton by E.I. du Pont de Nemours and Company.

Figure 5D:
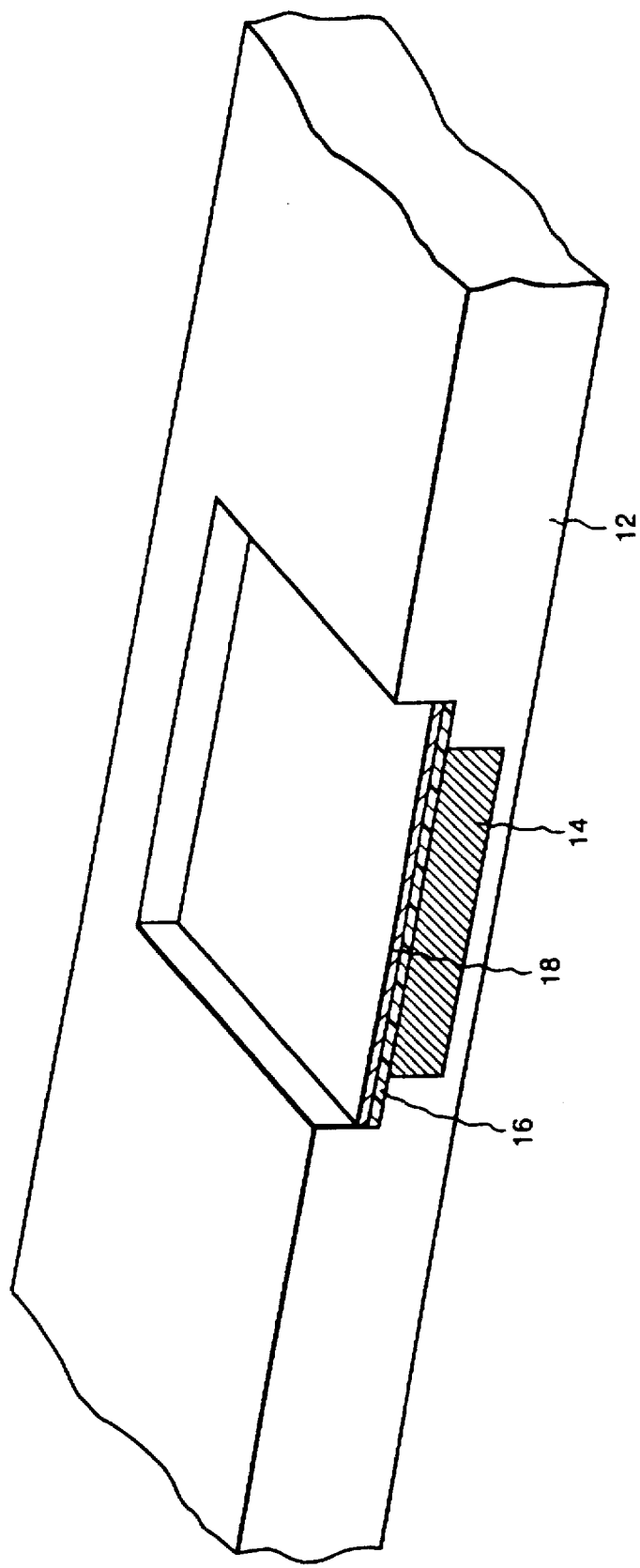
Figure 5E:
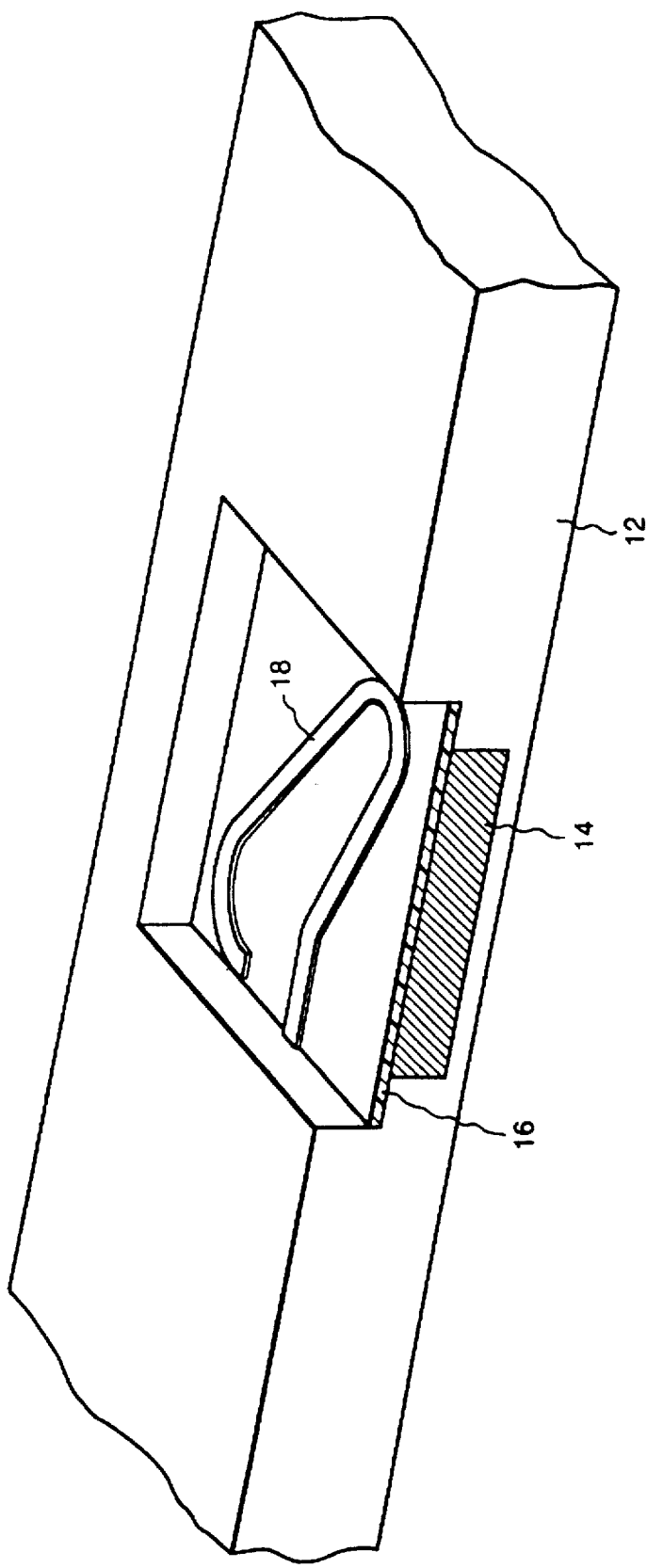
Figure 5F:
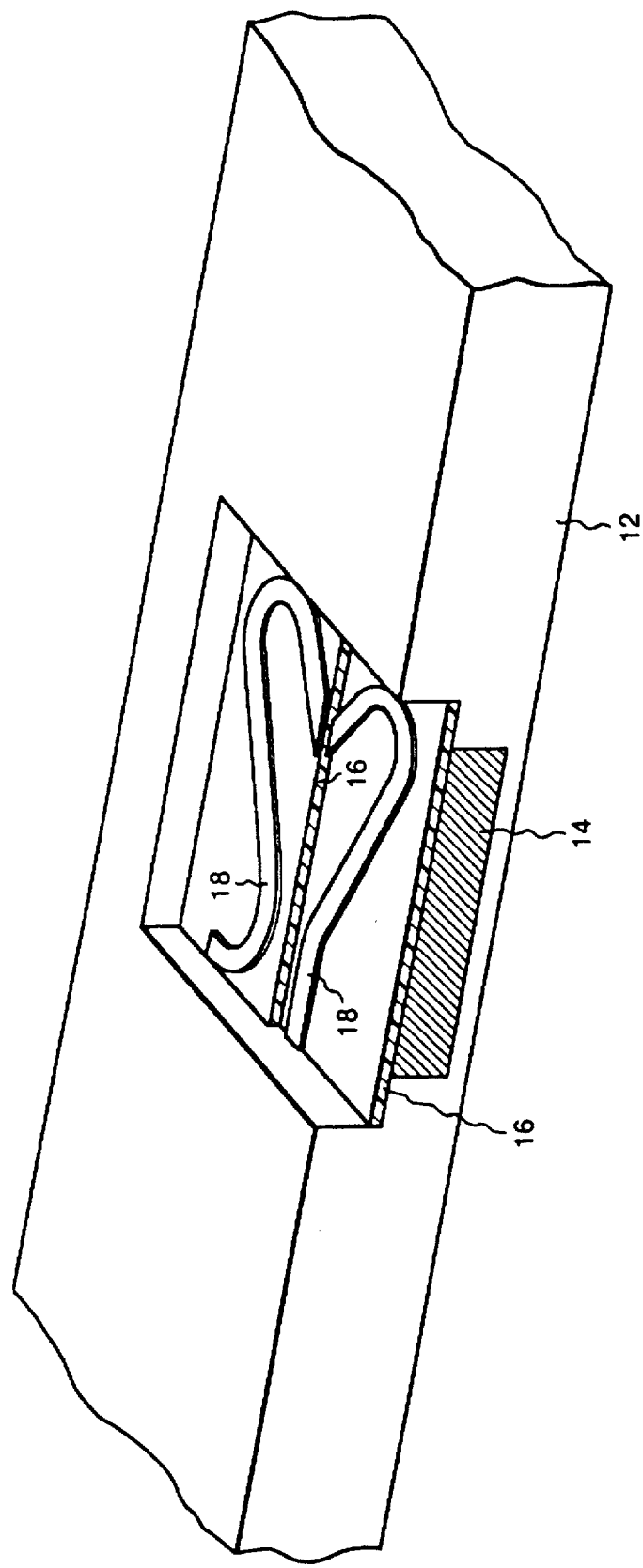

As shown in FIG. 5d, a first metal layer 18 is sputtered on the first Kapton polyimide film layer. A suitable metal layer comprises copper or a combination of titanium and copper of thickness in the range, for example, from approximately 1000 to 2500 Angstroms. The metal layer is then electroplated to a desired thickness (e.g., approximately 0.001 inch). Finally, the metal layer is patterned, as shown in FIG. 5e, using photoresist masking and wet etching according to well-known methods.

Another dielectric layer 16 (e.g., Kapton polyimide film) is laminated over the first winding layer. Primary winding vias 46 and secondary winding vias 48 (FIGS. 3a and 3b, respectively) are laser-drilled according to well-known methods to provide the illustrated winding patterns. Then, deposition of the second winding layer 18 occurs, as shown in FIG. 3f. The process continues until all winding layers are deposited and patterned within the HDI cavity. Alternatively, well-known meshed-based patterning and drilling methods, such as reactive ion etching (RIE), may be used.

On the top winding layer, an additional dielectric (Kapton polyimide film) layer may be laminated as a passivation layer. Then, a conformal metal mask is provided for patterning large through-holes 20 (FIG. 1). An excimer laser ablation can be used to drill holes 20 through to bottom ferrite plate 14. Alternatively, holes 20 may extend down only to a specified Kapton polyimide film layer in order to provide for an air gap in the magnetic circuit, as desired. In this way, a predetermined inductance may be achieved. Posts 22 are inserted into through-holes 20, and another Kapton polyimide film layer (not shown) is preferably laminated on top of plate 24 for further support of transformer 10 within cavity 40.

Figure 6A:
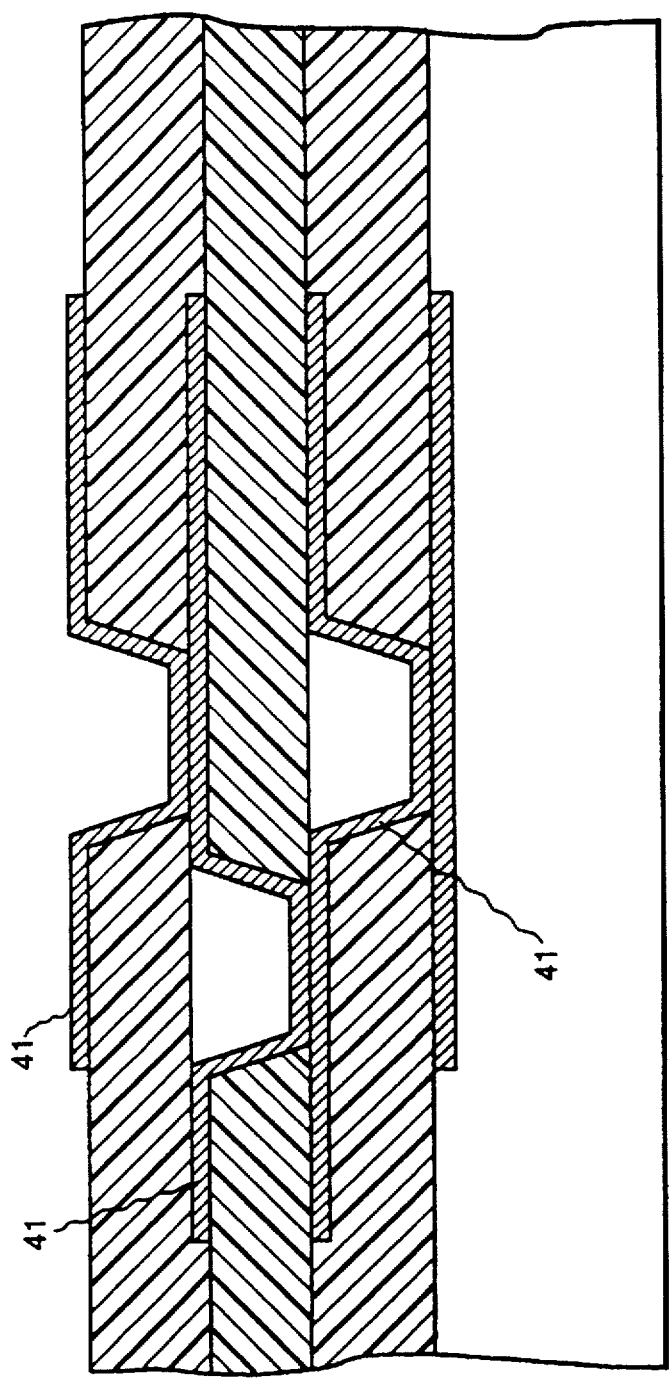
FIGS. 6a and 6b illustrate staggered via interlayer connections and plated-through-hole interconnections, respectively, for making primary and secondary contacts on the surface of the top dielectric layer of a magnetic component according to the present invention.
Figure 6B:
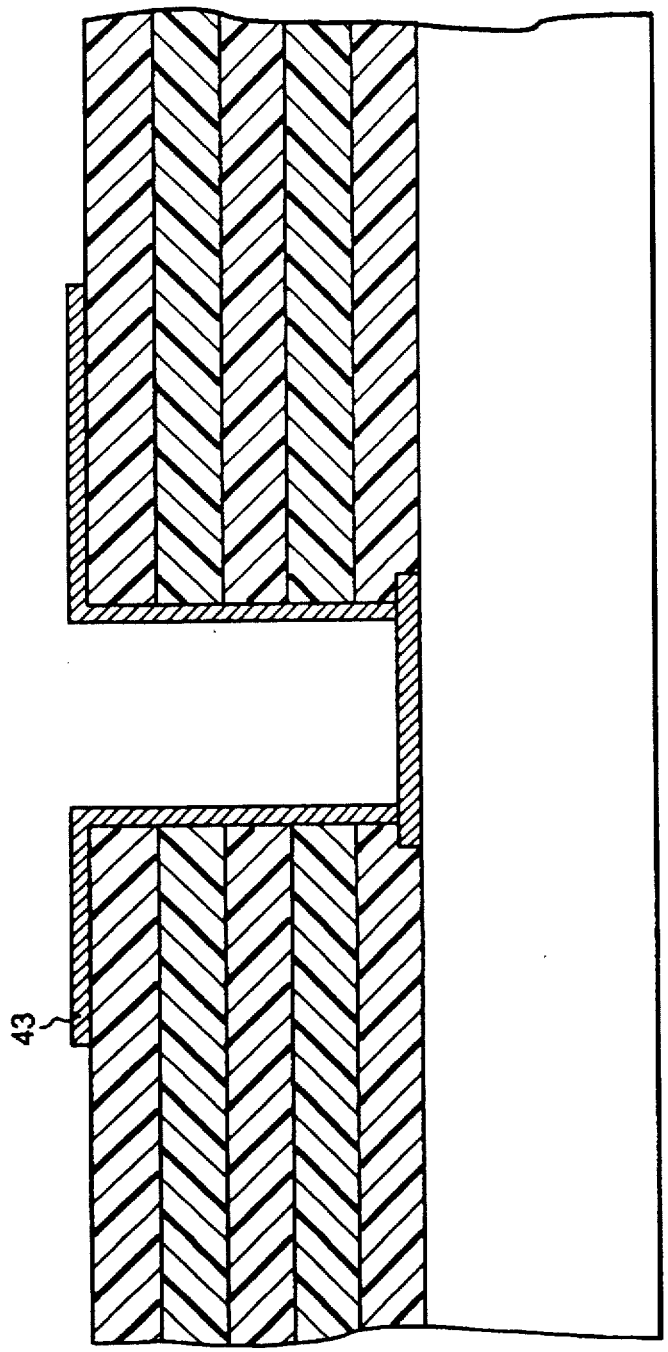

As each layer is formed, primary and secondary winding contacts are brought up to contact pads 39 (FIG. 1) that may be either recessed, as shown, or on the top surface of the last dielectric layer using either staggered via interlayer connections 41, as illustrated in FIG. 6a, or plated-through-hole interconnections 43, as illustrated in FIG. 6b.

Figure 7A:
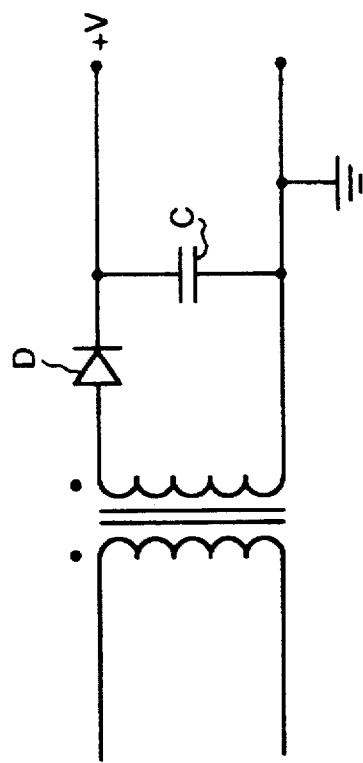
FIGS. 7a–7f illustrate how an integrated transformer of the present invention may be connected to secondary side circuit elements in, for example, a power supply.

FIGS. 7a–7f illustrate how an integrated transformer according to the present invention can be connected to secondary side circuit elements in, for example, a power supply. To this end, FIG. 7a is a circuit diagram of a simple secondary side circuit comprising a diode rectifier D and a filter capacitor C with two output terminals, +V and ground.

Figure 7B:
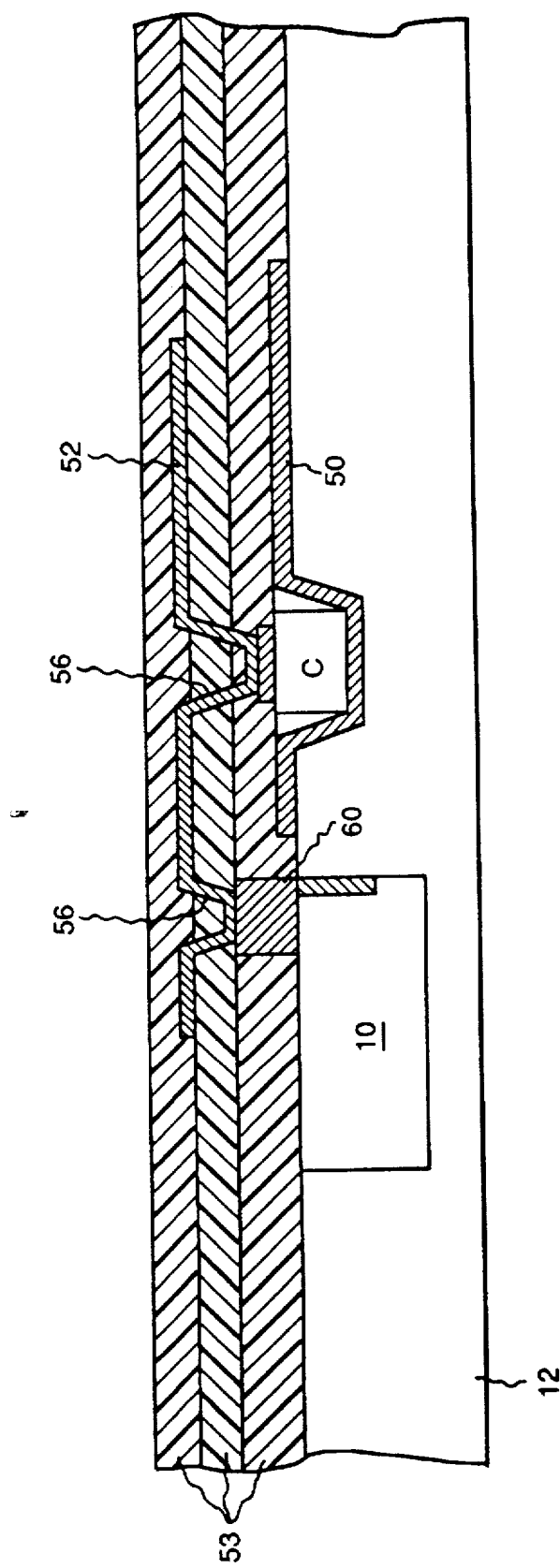
Figure 7C:
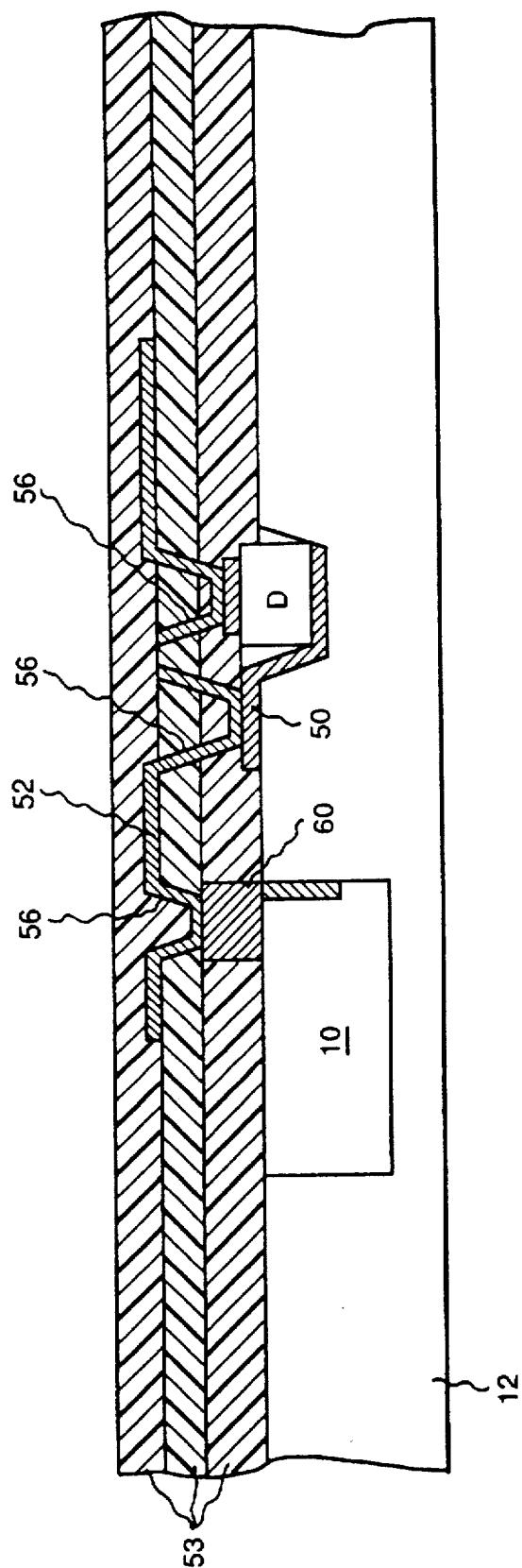

FIGS. 7b and 7c show a secondary-side interconnection scheme for an HDI circuit including a transformer 10 having terminations 60 at the top thereof. Two metal layers 50 and 52, with dielectric layers 53 used for insulation thereof, are used for connection to diode D (FIG. 7c) and capacitor C (FIG. 7b). Metal layer 50 is deposited directly on ceramic substrate 12 and forms part of the ground terminal of the power supply. Metal layer 50 connects the transformer, the diode and the capacitor through metallized vias 56 to metal layer 52. Metal layer 52 also serves as the +V (power) output terminal of the power supply. Advantageously, by configuring the transformer in an HDI structure in accordance with the present invention, very low inductance connections are thus made to secondary side circuit elements.

Figure 7D:
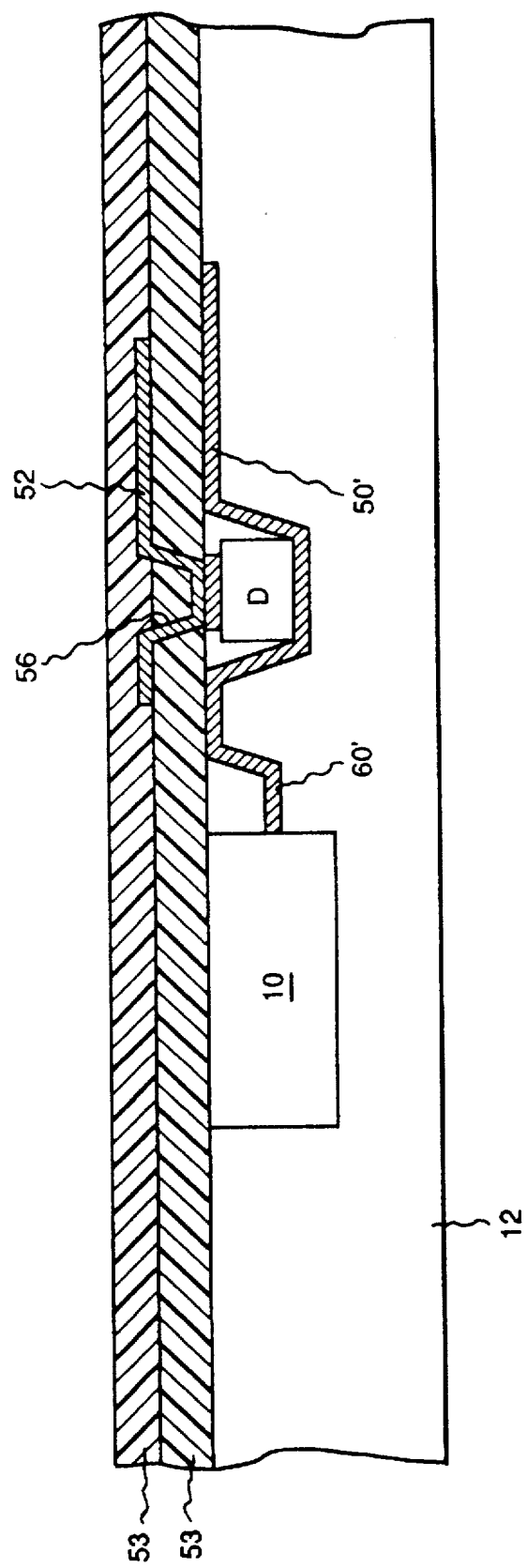
Figure 7E:
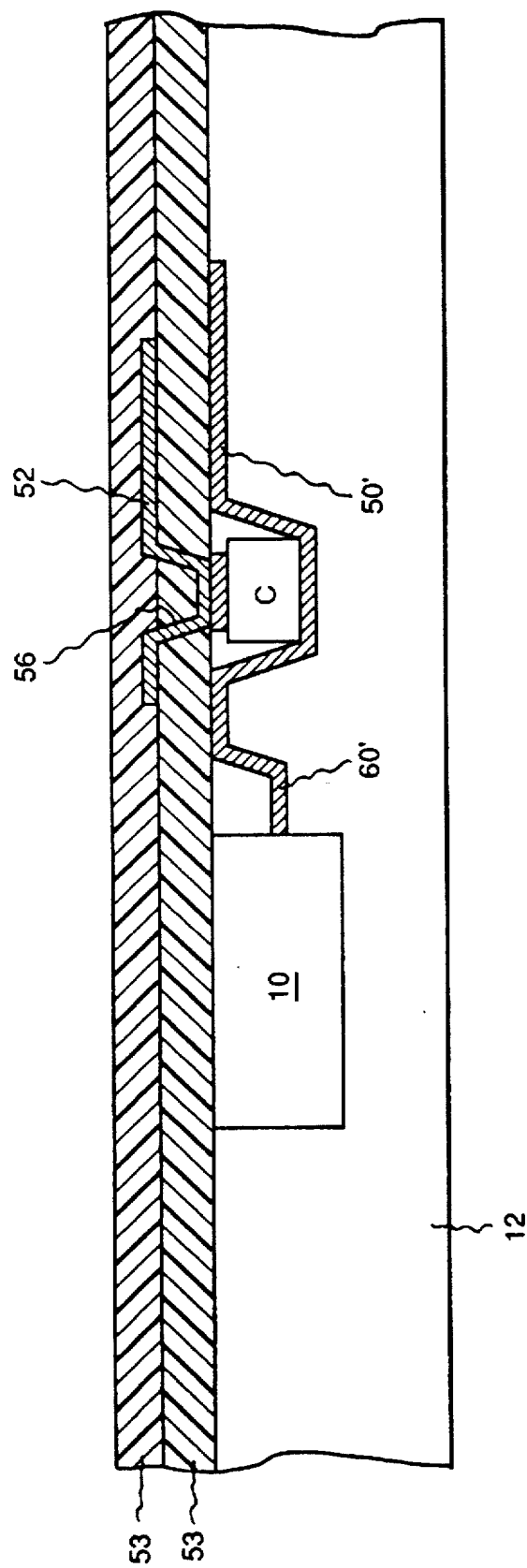
Figure 7F:
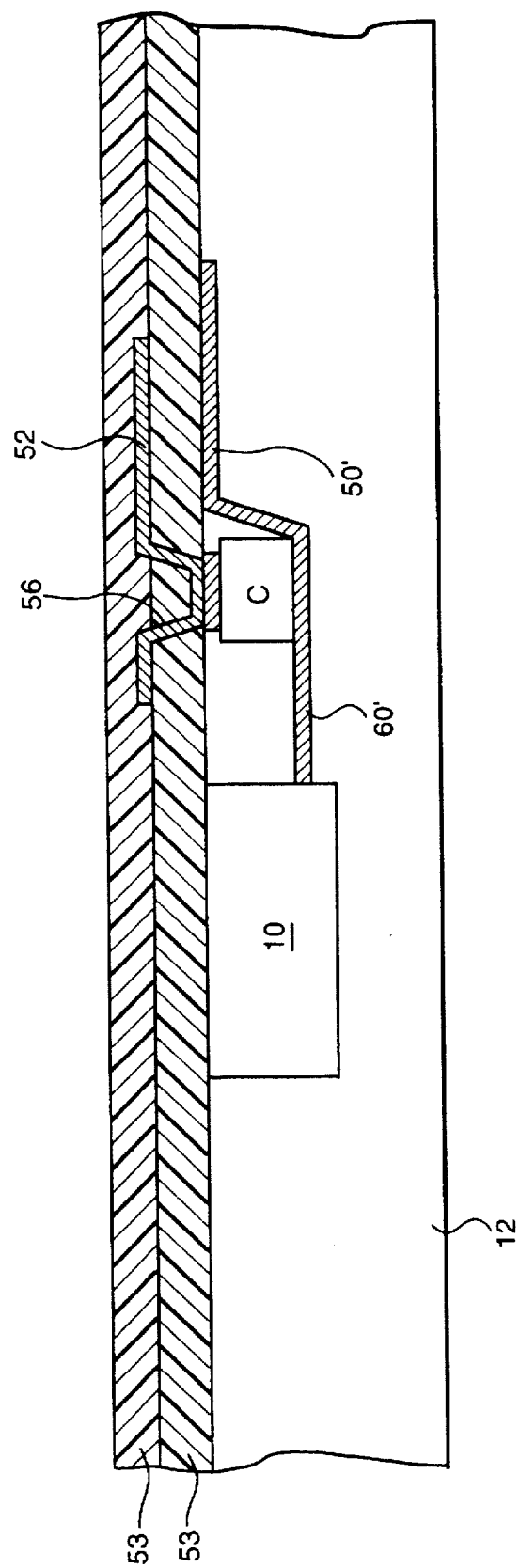

FIGS. 7d–7f show alternative ways of interconnecting transformer 10 and secondary side circuit elements (e.g., capacitor C and diode D of FIG. 7a) wherein the terminations 60' of the transformer are recessed below the top surface of the transformer. As in the embodiments of FIGS. 7b and 7c, two metal overlayers 50' and 52 are used in combination with vias 56 to make the interconnections and to provide the output terminals (power and ground planes) of the power supply. Like the connections of FIGS. 7b and 7c, those of FIGS. 7d–7f have very low inductance.

The secondary side interconnections in a power supply, such as those described hereinabove, typically carry substantially heavier current than those of the primary side circuit (not shown). Thus, thicker metallization is needed for the secondary side interconnections and output terminals. In accordance with the present invention, a process of differential plating is employed to obtain the desired metal thickness on the two metal overlayers 50 (or 50') and 52 shown in FIGS. 7b–7f. Since a thicker metal layer is needed on the secondary side of the circuit to accommodate the higher secondary side circuit, a mask is used on the primary side circuit such that additional metal is deposited only on the secondary portion of the metal layer.

In general, the purposes of differential plating according to the present invention are: (1) to minimize losses by matching the skin depth of high frequency circuitry to conductor thickness; (2) to optimize the design rules for fabricating the HDI circuits; and (3) to minimize losses for low frequency dc resistances.

FIGS. 8a–8e illustrate the steps in differential plating of an HDI circuit according to the present invention. By way of illustration, FIGS. 8a–8e show differential plating of primary and secondary side HDI circuits. However, it is to be understood that the differential plating method of the present invention may be employed in the fabrication of a single component by varying the thicknesses of different layers or other portions thereof.

FIG. 8a shows HDI substrate 12 with a layer of dielectric 16 (e.g., Kapton polyimide film) and a layer of thin metal 18 (e.g., copper or a combination of copper and titanium) deposited thereon. A process of subtractive differential plating is employed as follows. In FIG. 8b, a mask 80 is applied to the primary side circuit. FIG. 8c shows additional plating 18b added to the thin metal layer 18a (formerly 18). Together, layers 18a and 18b are represented by the numeral 18'. After application of a photoresist to both the primary and secondary side circuits, a portion of layer 18' is etched away to form the desired conductor shape, as shown in FIG. 8d. Then, after another application of photoresist to the entire HDI circuit, FIG. 8e shows that mask 80 is removed from the primary side circuit, and the primary side metal layer is etched to the desired conductor shape.

Figure 9A:
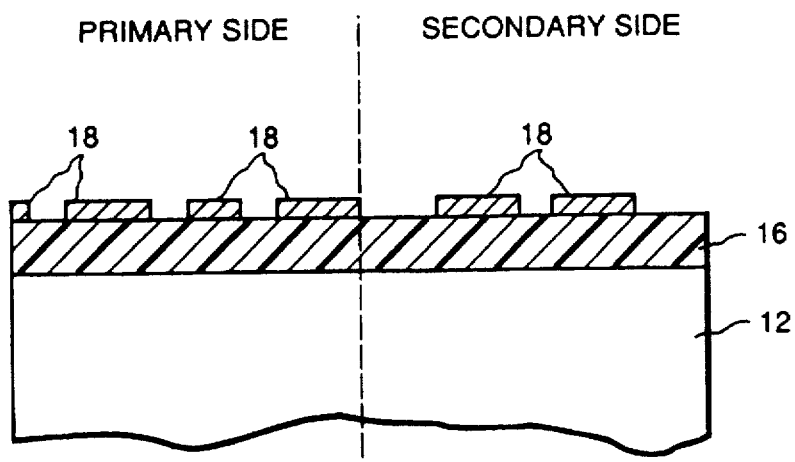
FIGS. 9a–9c illustrate differential plating steps according to an alternative embodiment of the present invention.
Figure 9B:
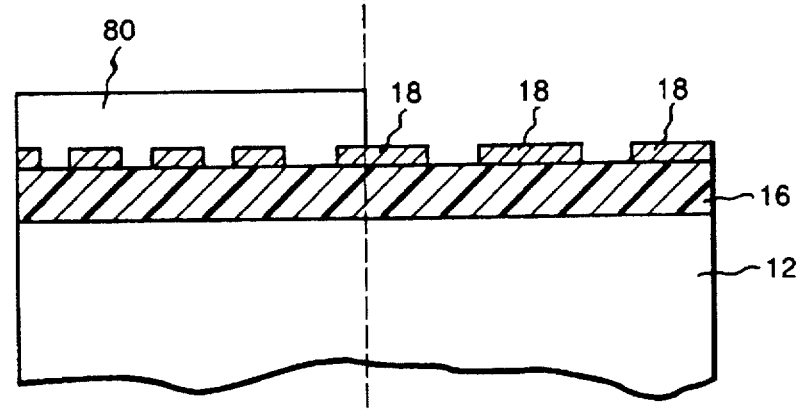
Figure 9C:
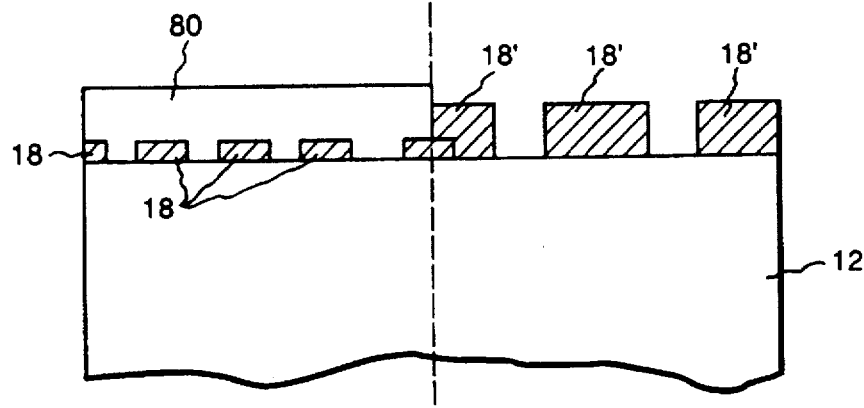

FIGS. 9a–9c illustrate differential plating according to an alternative embodiment of the present invention, i.e., involving an additive process. Substrate 12 is shown in FIG. 9a with dielectric layer 16 and an etched thin metal layer 18 on both the primary and secondary circuits. In FIG. 9b, a mask 80 is applied to the primary side of the circuit, and in FIG. 9c, the secondary side metal traces are made thicker by electroless plating of additional metal thereon to form the thicker layer 18'.

Figure 10A:
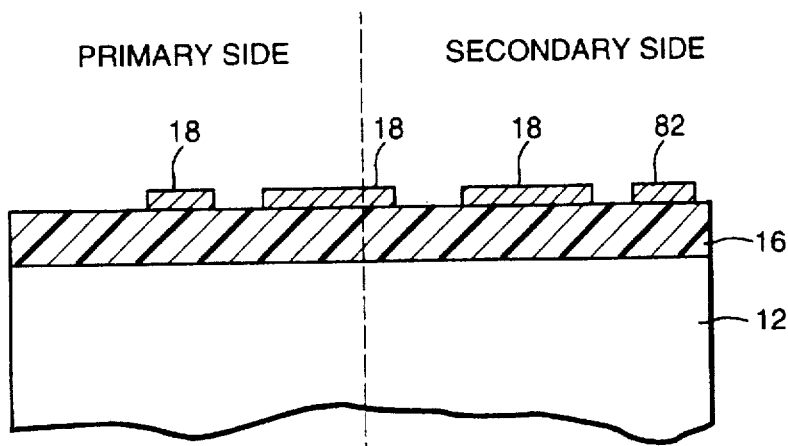
FIGS. 10a–10d illustrate differential plating steps according to another alternative embodiment of the present invention.
Figure 10B:
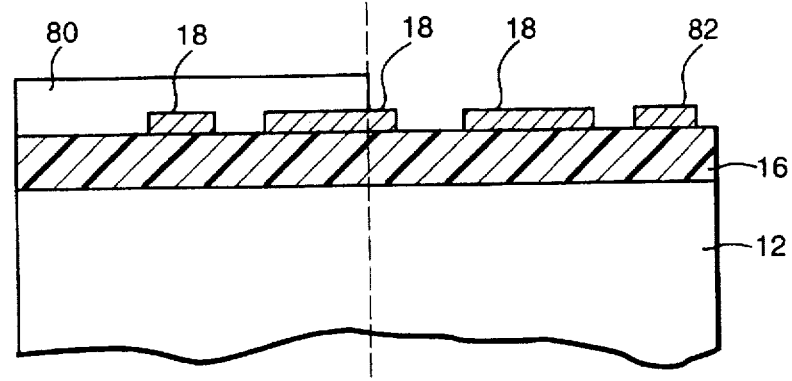
Figure 10C:
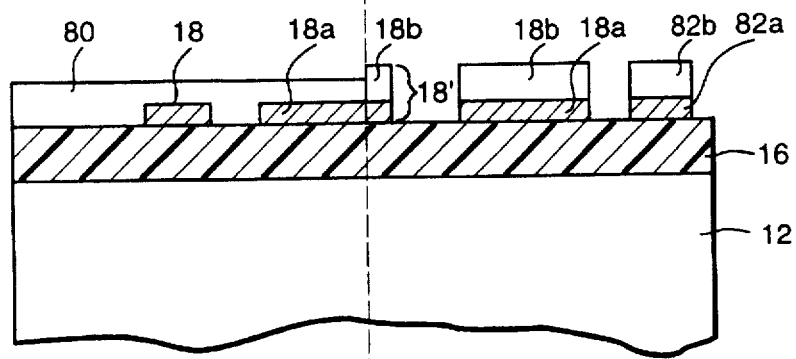
Figure 10D:
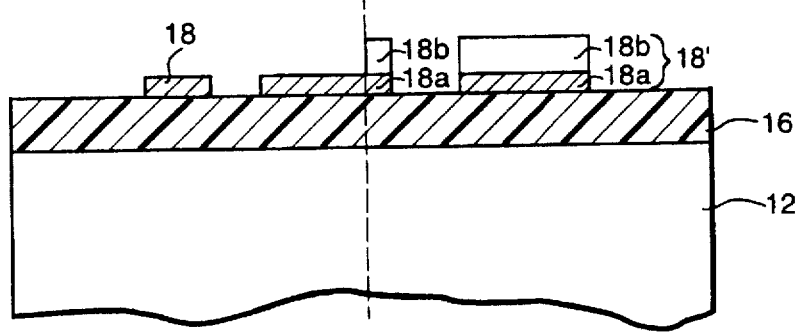

FIGS. 10a–10d illustrate differential plating according to another alternative embodiment which also involves an additive plating process. Substrate 12 is shown in FIG. 10a with dielectric layer 16 and an etched thin metal layer 18 on both the primary and secondary sides of the HDI circuit. In addition, the secondary side circuit includes a shorting bar 82 of a type used in well-known electroplating processes. As shown in FIG. 10b, the primary side circuit is masked. Then, using shoring bar 82 in well-known manner, the secondary side circuit is electroplated to apply additional metal layer 18b to layer 18a. FIG. 10d shows the HDI structure with the mask and the shorting bar removed.

Despite the advantages of differential plating in many applications, uniformly plated interconnections (including primary and secondary nterconnections) may be desirable for many other applications. For such applications, uniform electroplating may be advantageous due to: planarity of the metal layers; lower dc and ac losses; and more compact primary side circuitry as thinner metal traces can be used.

Figure 11:
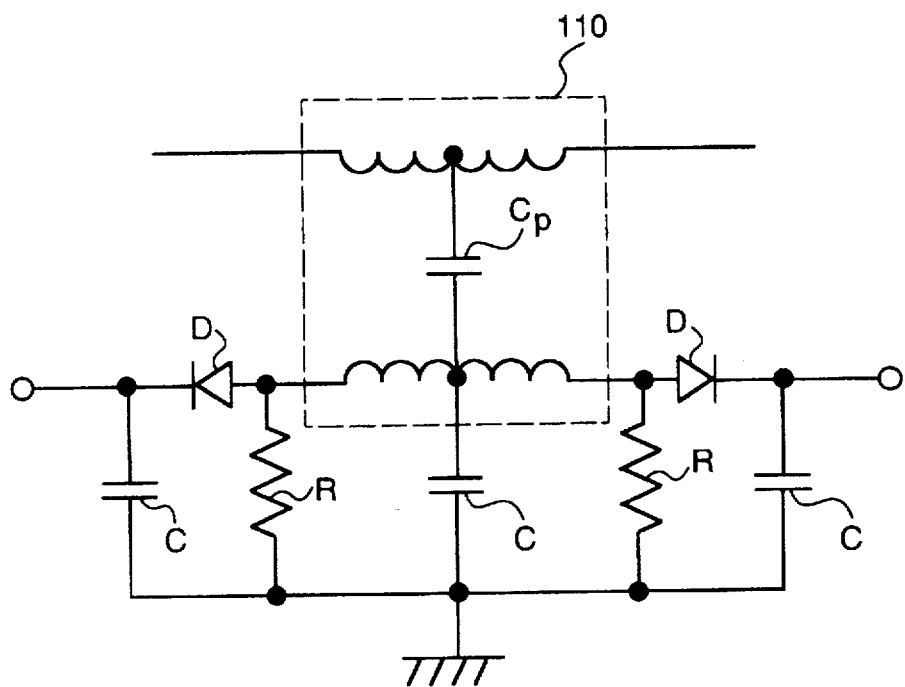
FIG. 11 schematically illustrates an electromagnetic circuit component (e.g., a directional coupler) suitable for construction in an HDI structure in accordance with the present invention.

FIG. 11 schematically illustrates a distributed electromagnetic circuit component (e.g., a directional coupler) suitable for construction using HDI technology in accordance with the present invention. The invention, however, is not limited to directional couplers, but applies to any suitable distributed electromagnetic circuit component, such as, for example, isolators, waveguides, phase-shifters and circulators, and so on. A distributed electromagnetic circuit component has a distributed electromagnetic field due to both electric and magnetic coupling therein so as to provide distributed wave propagation in either or both a forward and reverse direction. Moreover, the wavelength of propagation in a distributed electromagnetic component is smaller than the effective component size, as opposed to a lumped magnetic component, such as those described hereinabove, which has a wavelength greater than the effective component size.

Specifically, FIG. 11 illustrates a directional coupler 10 having a predetermined parasitic capacitance Cp. As in a typical application, coupler 10 is shown as being coupled to external circuitry, including capacitors C, diodes D and resistors R, for example. The coupler of FIG. 11 is constructed in similar manner as the transformer of FIG. 1. However, in contrast to standard transformers, such as those described hereinabove, coupler 10 is constructed to have a predetermined parasitic capacitance Cp. In particular, differential plating of the metal thickness between primary and secondary winding layers yields a defined point in the coupler transformer at which the capacitive coupling Cp exists, as illustrated in FIG. 11.

Figure 12:
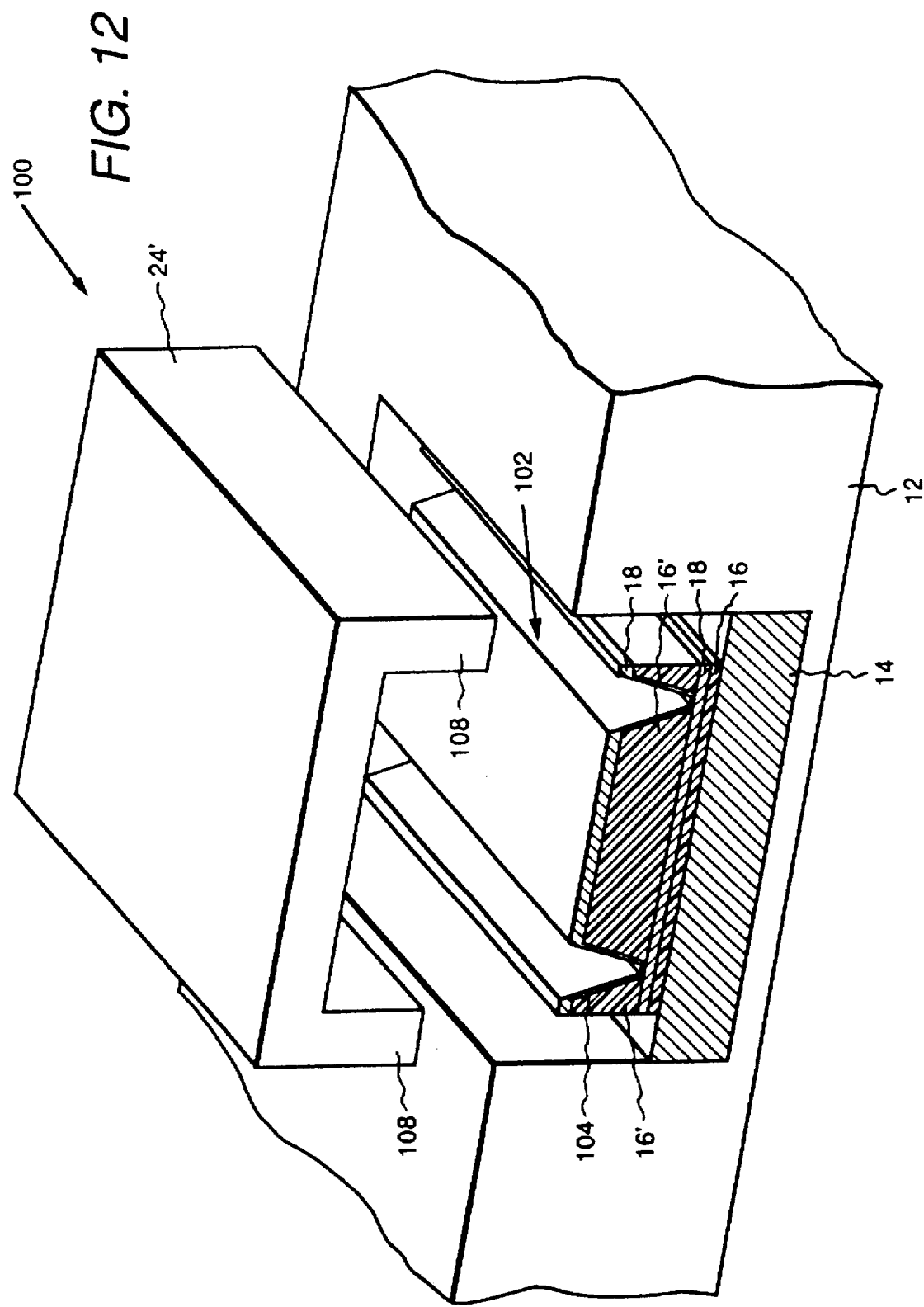
FIG. 12 is an exploded, perspective view of an isolator for a microwave waveguide constructed in accordance with the present invention.

FIG. 12 illustrates another application of an electromagnetic HDI structure according to the present invention comprising an isolator 100 for a microwave waveguide 102. As described hereinabove, magnetic plate 14 is situated within a cavity within HDI substrate 12. A dielectric layer 16 is applied to magnetic plate 14. The top and bottom of waveguide 102 comprise metal layers 18 which are connected together by vias 104. In particular, vias 104 are illustrated as comprising trench vias. However, multiple vias (not shown) may be alternatively employed. Another dielectric layer 16' is disposed between the top and bottom metal layers and comprises the waveguide cavity. A magnetic top plate 24' has sides 108 such that it fits around the microwave waveguide within the HDI cavity in substrate 12.

Figure 13:
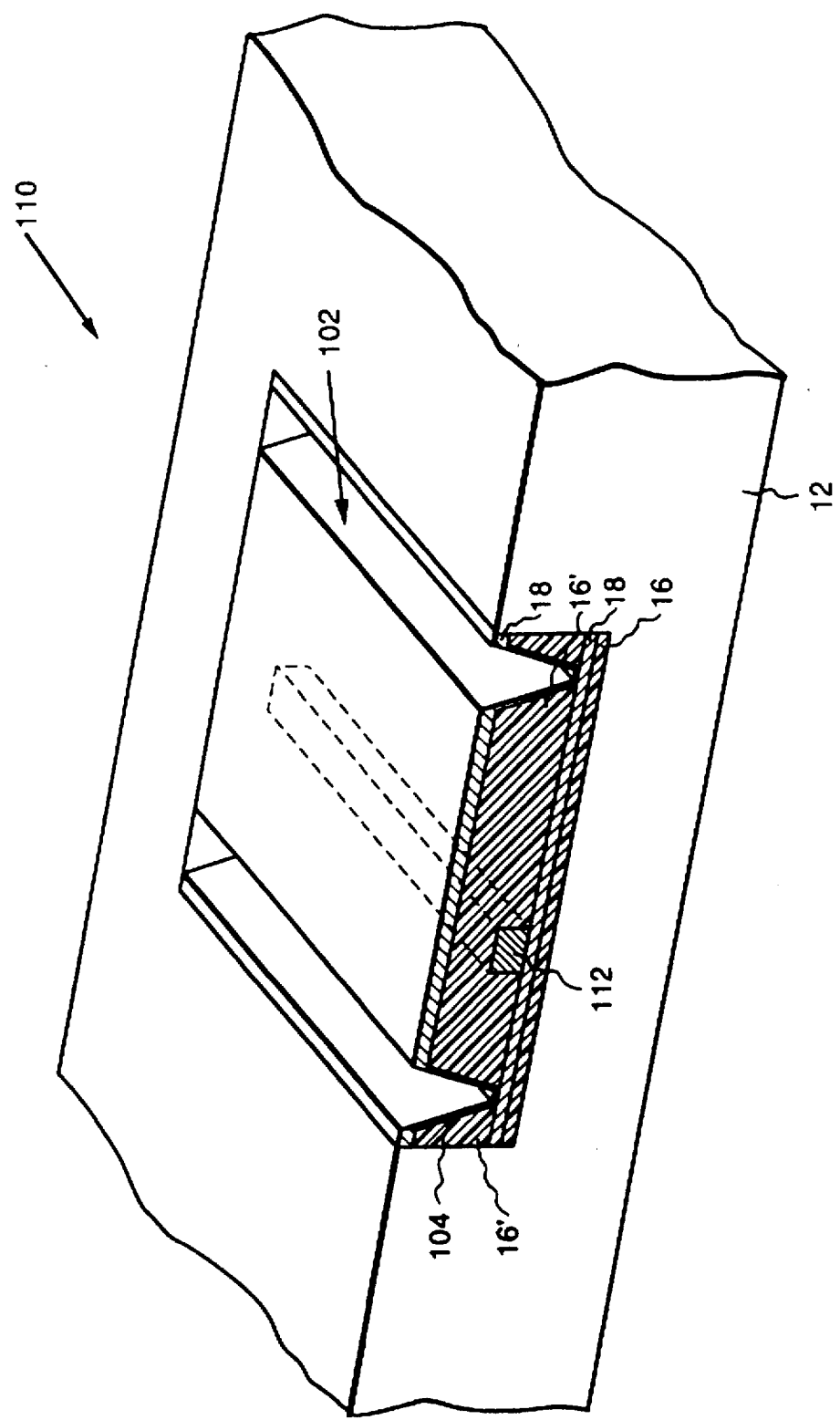
FIG. 13 is an exploded, perspective view of an alternative embodiment of the isolator of FIG. 12.

FIG. 13 illustrates an alternative embodiment (110) of the isolator of FIG. 12. A ferromagnetic insert 112 is employed instead of the magnetic top and bottom plates, 108 and 14, respectively of FIG. 12. As will be appreciated by those of ordinary skill in the art, operation of isolator 100 of FIG. 12 and isolator 110 of FIG. 13 is in a similar manner.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for making an HDI circuit component, comprising:
    (a) forming a cavity in an HDI dielectric substrate, said cavity having a bottom surface;
    (b) machining a magnetic plate to the length and width dimensions of said cavity;
    (c) inserting at least one magnetic plate in said cavity,
    (d) disposing alternating dielectric and metal layers on said at least one magnetic plate;
    (e) electroplating each of said metal layers to a predetermined thickness;
    (f) patterning each of said metal layers;
    (g) repeating steps (d) through (g) until all metal layers are deposited and patterned within said cavity.

2. The method of claim 1 wherein said at least one magnetic plate comprises a base plate and a top plate.

3. The method of claim 1 wherein said at least one magnetic plate is situated between selected ones of said alternating dielectric and metal layers.

4. The method of claim 1, further comprising the step of attaching said magnetic base plate within said cavity using an adhesive.

5. The method of claim 1, further comprising the step of forming vias for making connections between selected metal layers.

6. The method of claim 1, further comprising the step of making low inductance terminations for connecting said HDI circuit component to other circuit elements.

7. The method of claim 6 wherein said terminations are recessed.

8. The method of claim 6 wherein said terminations are situated toward the top of said HDI circuit component.

9. The method of claim 2, further comprising the step of providing an air gap between said magnetic top plate and said magnetic bottom plate.

10. The method of claim 2, further comprising the step of:
    forming at least one hole through the alternating dielectric and metal layers to form at least one magnetic pole, said magnetic top plate including at least one core post for insertion through said at least one hole.

11. The method of claim 10 wherein said at least one core post extends down to a predetermined one of said dielectric layers so as to provide an air gap.

12. The method of claim 10 wherein said at least one core post extends down to said magnetic base plate.

13. The method of claim 1 wherein said magnetic plates each comprise a ferromagnetic material.

14. The method of claim 1 wherein said magnetic plates each comprise a magnetically polarized material.

15. The method of claim 1 wherein said dielectric layers each comprise Kapton polyimide film.

16. The method of claim 1 wherein said metal layers comprise copper.

17. The method of claim 1 wherein said metal layers comprise a combination of titanium and copper.

18. The method of claim 1 wherein said HDI dielectric substrate comprises a ceramic.

19. The method of claim 1 wherein said metal layers comprise primary and secondary winding layers, said HDI circuit component comprising a transformer.

20. The method of claim 19, further comprising the step of forming vias for making connections between primary and secondary winding layers, respectively.

21. The method of claim 19, further comprising the step of making low inductance terminations for connecting said transformer to other circuit elements.

22. The method of claim 21 wherein said terminations are recessed.

23. The method of claim 21 wherein said terminations are situated toward the top of said transformer.

24. The method of claim 19 wherein said at least one magnetic plate comprises a base plate and a top plate.

25. The method of claim 24, further comprising a predetermined air gap between said magnetic top plate and said magnetic base plate.

26. The method of claim 1 wherein said HDI circuit component comprises a directional coupler.

27. The method of claim 1 wherein said HDI circuit component comprises an isolator for a waveguide.

28. The method of claim 1 wherein said electroplating step comprises differential electroplating such that the thickness of said metal layer varies.

29. The method of claim 28 wherein said differential plating step comprises subtractive differential plating.

30. The method of claim 28 wherein said differential plating step comprises additive differential plating.

* * * * *